(12) United States Patent
Lin et al.

(10) Patent No.: US 11,251,072 B2
(45) Date of Patent: Feb. 15, 2022

(54) DIFFERENTIAL HARDMASKS FOR MODULATION OF ELECTROBUCKET SENSITIVITY

(71) Applicant: Intel Corporation, Santa Clara, CA (US)

(72) Inventors: Kevin L. Lin, Beaverton, OR (US); Robert L. Bristol, Portland, OR (US); James M. Blackwell, Portland, OR (US); Rami Hourani, Portland, OR (US); Marie Krysak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 267 days.

(21) Appl. No.: 16/346,305

(22) PCT Filed: Dec. 23, 2016

(86) PCT No.: PCT/US2016/068581
§ 371 (c)(1),
(2) Date: Apr. 30, 2019

(87) PCT Pub. No.: WO2018/118088
PCT Pub. Date: Jun. 28, 2018

(65) Prior Publication Data
US 2019/0318959 A1 Oct. 17, 2019

(51) Int. Cl.
*H01L 23/522* (2006.01)
*H01L 21/768* (2006.01)
(Continued)

(52) U.S. Cl.
CPC .... *H01L 21/76816* (2013.01); *H01L 21/0273* (2013.01); *H01L 21/31111* (2013.01);
(Continued)

(58) Field of Classification Search
CPC .................................................. H01L 23/522
See application file for complete search history.

(56) References Cited

U.S. PATENT DOCUMENTS

| 6,861,376 B1 | 3/2005 | Dian-Hua et al. |
| 9,041,217 B1 | 5/2015 | Bristol et al. |
| (Continued) | | |

FOREIGN PATENT DOCUMENTS

| WO | WO 2016/048264 | 3/2016 |
| WO | WO 2016/105423 | 6/2016 |

OTHER PUBLICATIONS

International Preliminary Report on Patentability for International Patent Application No. PCT/US2016/068581 dated Jul. 4, 2019, 6 pgs.

(Continued)

*Primary Examiner* — Moazzam Hossain
*Assistant Examiner* — Hajar Kolahdouzan
(74) *Attorney, Agent, or Firm* — Schwabe, Williamson & Wyatt, P.C.

(57) ABSTRACT

Approaches based on differential hardmasks for modulation of electrobucket sensitivity for semiconductor structure fabrication, and the resulting structures, are described. In an example, a method of fabricating an interconnect structure for an integrated circuit includes forming a hardmask layer above an inter-layer dielectric (ILD) layer formed above a substrate. A plurality of dielectric spacers is formed on the hardmask layer. The hardmask layer is patterned to form a plurality of first hardmask portions. A plurality of second hardmask portions is formed alternating with the first hardmask portions. A plurality of electrobuckets is formed on the alternating first and second hardmask portions and in openings between the plurality of dielectric spacers. Select ones of the plurality of electrobuckets are exposed to a litho- (Continued)

graphic exposure and removed to define a set of via locations.

6 Claims, 19 Drawing Sheets

(51) Int. Cl.
    *H01L 21/027*     (2006.01)
    *H01L 21/311*     (2006.01)

(52) U.S. Cl.
    CPC .. *H01L 21/31144* (2013.01); *H01L 21/76825* (2013.01); *H01L 21/76877* (2013.01); *H01L 21/76897* (2013.01)

(56) References Cited

U.S. PATENT DOCUMENTS

| | | | |
|---|---|---|---|
| 2002/0052088 A1* | 5/2002 | Okamoto | H01L 21/823871 438/377 |
| 2009/0236309 A1 | 9/2009 | Millward | |
| 2011/0287348 A1 | 11/2011 | Yoon et al. | |
| 2013/0084655 A1 | 4/2013 | Yue et al. | |
| 2014/0038412 A1 | 2/2014 | Hu et al. | |
| 2014/0272711 A1 | 9/2014 | Bristol et al. | |
| 2019/0318958 A1* | 10/2019 | Bristol | H01L 21/76837 |

OTHER PUBLICATIONS

International Search Report and Written Opinion for International Patent Application No. PCT/US2016/068581 dated Aug. 31, 2017, 7 pgs.

Partial Search Report from European Patent Application No. 16924666.7, dated Aug. 3, 2020, 10 pages.

Search Report from European Patent Application No. 16924666.7, dated Nov. 3, 2020, 9 pages.

* cited by examiner

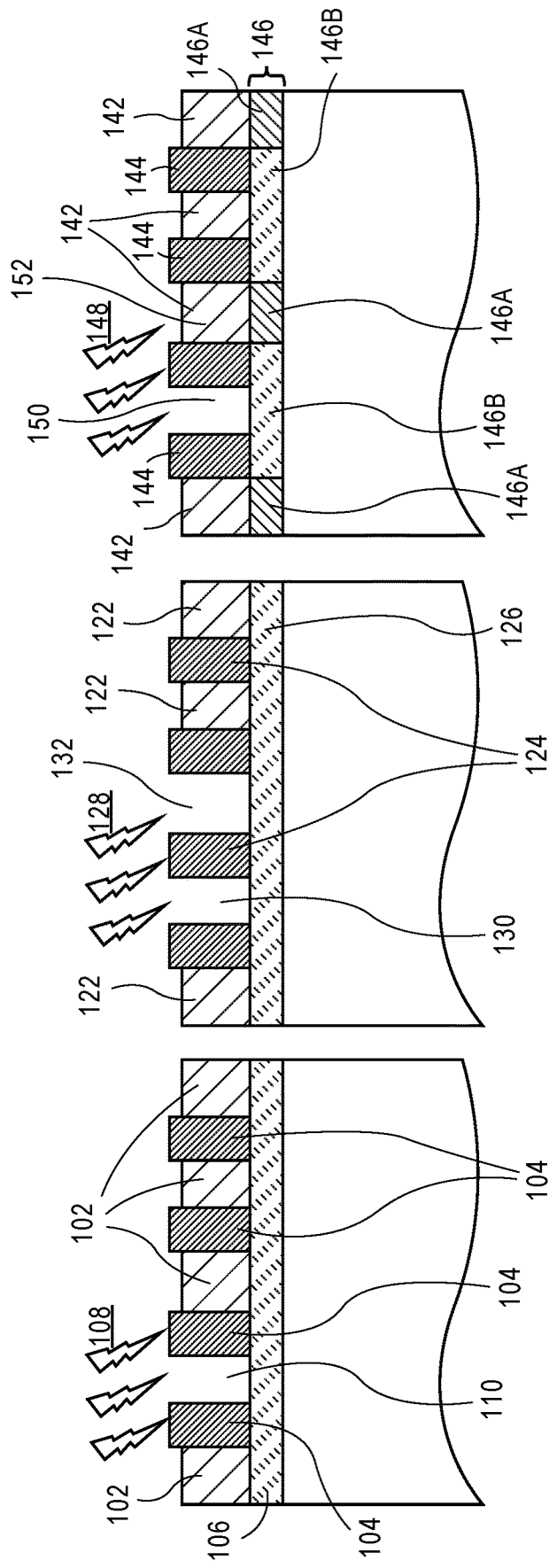

DIFFERENTIAL HARDMASKS FOR MODULATION OF ELECTROBUCKET SENSITIVITY

CROSS-REFERENCE TO RELATED APPLICATION

This patent application is a U.S. National Phase Application under 35 U.S.C. § 371 of International Application No. PCT/US2016/068581, filed Dec. 23, 2016, entitled "DIFFERENTIAL HARDMASKS FOR MODULATION OF ELECTROBUCKET SENSITIVITY," which designates the United States of America, the entire disclosure of which is hereby incorporated by reference in its entirety and for all purposes.

TECHNICAL FIELD

Embodiments of the invention are in the field of semiconductor structures and processing and, in particular, approaches based on underlying differential hardmasks for modulation of electrobucket sensitivity for semiconductor structure fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less.

One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 1A illustrates a cross-sectional view of a conventional aligned electrobucket process.

FIG. 1B illustrates a cross-sectional view of a conventional mis-aligned electrobucket process.

FIG. 1C illustrates a cross-sectional view of a mis-aligned electrobucket process, in accordance with an embodiment of the present invention.

FIGS. 4A-4F, illustrate cross-sectional views corresponding to various operations in a method of fabricating and using a differentiated hardmask in an electrobucket process, in accordance with an embodiment of the present invention.

FIG. 8A illustrates a starting point structure for a subtractive via process following deep metal line fabrication;

FIG. 8B illustrates the structure of FIG. 8A following recessing of the metal lines;

FIG. 8C illustrates the structure of FIG. 8B following formation of an inter-layer dielectric (ILD) layer;

FIG. 8D illustrates the structure f FIG. 8C following deposition and patterning of a hardmask layer;

FIG. 8E illustrates the structure of FIG. 8D following trench formation defined using the pattern of the hardmask of FIG. 8D;

FIG. 8F illustrates the structure of FIG. 8E following electrobucket formation in all possible via locations with differentiated hardmasks in alternating locations;

FIG. 8G illustrates the structure of FIG. 8F following via location selection;

FIG. 8H illustrates the structure of FIG. 8G following conversion of the remaining electrobuckets to permanent ILD material; and FIG. 8I illustrates the structure of FIG. 8H following metal e and via formation.

DESCRIPTION OF THE EMBODIMENTS

Figure 2A:
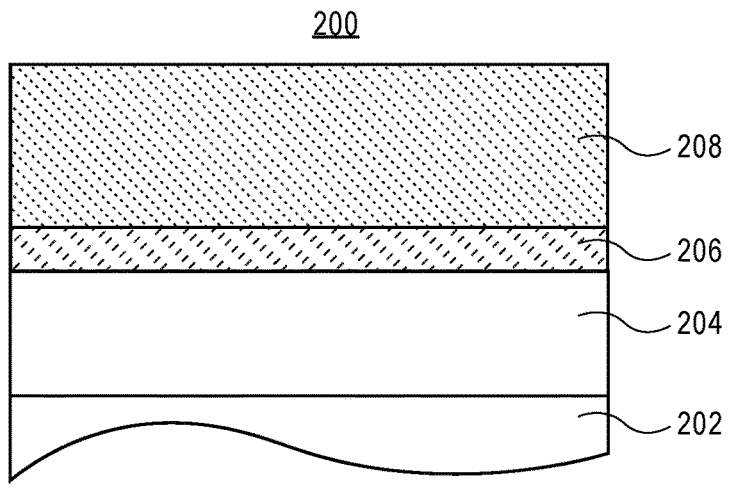
FIGS. 2A-2O illustrate cross-sectional views of various operations in a method of patterning using electrobuckets with differentiated hardmasks, in accordance with an embodiment of the present invention.

Approaches based on underlying differential hardmasks for modulation of electrobucket sensitivity for semiconductor structure fabrication, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein is directed to electrobucket underlying hardmask "colors" that differentiate electrobucket performance. Applications may be directed toward one or more of electron beam (e-beam) lithography, extreme ultra-violet (EUV) lithography, general lithography applications, solutions for overlay issues (such as edge placement error, EPE), and general photoresist technologies. In an embodiment, materials are described that are suitable for improving performance of so-called "ElectroBucket" based approaches. In such an approach, a resist material is confined to a pre-patterned hardmask. Select ones of the electrobuckets are then removed using a high-resolution lithography tool, e.g., an e-beam or EUV lithography tool. Specific embodiments include use of materials and process flows to solve issues associated with unwanted via openings caused by lithographic critical dimension (CD) and/or overlay errors. Approaches described herein may be described as involving alternating and differentiated underlying hardmask technology.

To provide context, current fabrication techniques for vias involve a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned conductive vias, greatly simplifying the web of overlay errors, and leaving only one critical overlay step (Mx+1 grating). In an embodiment, then, offset due to conventional lithograph/dual damascene patterning that must otherwise be tolerated, is not a factor or is less of a factor for the resulting structures described herein.

To provide further context, a conventional resist electrobucket structure following electrobucket development may only partially clear after a mis-aligned exposure. Using a broader exposure window can ensure complete clearance of the selected electrobucket, but increases the risk of exposing non-selected neighboring electrobuckets. Thus, using conventional approaches, constraints regarding exposure size and misalignment tolerance are tight to avoid, if possible, either only partially cleared selected electrobuckets with some residual photoresist remaining or opening of non-selected electrobucket potentially leading to subsequent formation of conductive structures in unwanted locations.

More particularly, electrobuckets can be formed by fabricating "buckets" from a 2-dimensional grating to confine photoresist. The confined buckets of photoresist are then selectively exposed depending on where it is preferred to either keep or dissolve the photoresist. One challenge is the edge placement error control of such a patterning scheme. For example, if the electron beam is mis-aligned with respect to the bucket, then there is a risk of opening an unwanted bucket adjacent to the desired bucket.

By way of a first example, FIG. 1A illustrates a cross-sectional view of a conventional aligned electrobucket process. A plurality of electrobuckets 102 of photoresist is confined among "bucket" features 104 over a hardmask layer 106. An aligned e-beam or EUV exposure 108 of a select electrobucket location 110 is performed. Subsequently, the selected electrobucket 110 is opened upon development and removal of the selected and exposed photoresist in the location 110. The result of such an aligned process is the opening of a selected electrobucket at the selected location 110.

By way of a second example, FIG. 1B illustrates a cross-sectional view of a conventional mis-aligned electrobucket process. A plurality of electrobuckets 122 of photoresist is confined among bucket features 124 over a hardmask layer 126. A mis-aligned e-beam or EUV exposure 128 of a select electrobucket location 130 is performed. Subsequently, the selected electrobucket 130 is opened upon development and removal of the selected and exposed photoresist in the location 130. However, inadvertently, a neighboring electrobucket at location 132 is also opened because of the mis-alignment and resulting exposure by mis-aligned e-beam or EUV exposure 128. Accordingly, in addition to a desired electrobucket location 130, an unselected or undesired electrobucket is also opened at location 132.

Addressing one or more of the issues raised in the description of FIG. 1B, in accordance with one or more embodiments of the present invention, electrobucket approaches described herein involve the "coloring" hardmasks of adjacent buckets to change the sensitivity of the electrobucket. For example, some materials have more backscatter and generate more secondary electrons than other materials. By increasing the sensitivity of the desired bucket relative to the undesired bucket, reduce the risk of the undesired bucket opening due to mis-alignment of the electron beam with respect to the buckets can be reduced.

By way of example of a differentiated approach, FIG. 1C illustrates a cross-sectional view of a mis-aligned electrobucket process, in accordance with an embodiment of the present invention. A plurality of electrobuckets 142 of photoresist is confined among bucket features 144 over a hardmask layer 146. The hardmask 146 is differentiated in that it includes first hardmask portions 146A and second hardmask portions 146B. The materials of first hardmask portions 146A and second hardmask portions 146B, respectively, may differ in the extent of reaction to an exposure which effectively alters the performance of respective electrobuckets formed thereon.

Referring again to FIG. 1C, a mis-aligned e-beam or EUV exposure 148 of a select electrobucket location 150 is performed. Subsequently, the selected electrobucket 150 is opened upon development and removal of the selected and exposed photoresist in the location 150. However, although a neighboring electrobucket at location 152 is also exposed to mis-aligned e-beam or EUV exposure 128, the electrobucket at location 152 is not removed upon development of the electrobuckets. In an embodiment, the electrobuckets 142 on second hardmask portions 146B are more sensitive to an e-beam or EUV exposure by the underlying second hardmask portions 146B versus the neighboring or alternating electrobuckets 142 on first hardmask portions 146B. Accordingly, in the end, only the desired electrobucket location 150 is opened, while the unselected or undesired electrobucket (albeit exposed electrobucket) at location 152 is not opened. Thus, increased edge placement error tolerance and reduced risk of undesired bucket opening may be achieved.

Referring again to FIG. 1C, in an embodiment, the second hardmask portions 146B are rendered or modified to provide electrobuckets thereon with greater sensitivity to e-beam or EUV exposure as compared to electrobuckets formed on the first hardmask portions 146A. In another embodiment, the first hardmask portions 146A are rendered or modified to provide electrobuckets thereon with less or reduced sensitivity to e-beam or EUV exposure as compared to electrobuckets formed on the second hardmask portions 146B. In either case, in an embodiment, the second hardmask portions 146B provide for increased backscatter and the generation of more secondary electrons into electrobuckets thereon versus the backscatter and the generation of more secondary electrons provided by first hardmask portions 146A.

In accordance with an embodiment of the present invention, approaches described herein involve differentiated hardmask fabrication underlying electrobuckets to increase reactivity of areas of wanted vias and/or to slow down areas of unwanted vias in contrast to existing state-of-the-art approaches, fabrication schemes described herein involve the fundamentally different approach of using a selective bottom-up electrobucket differentiation methodology. By employing such a selective bottom-up electrobucket differentiation methodology, the need for self-enclosed via structures which otherwise take up metal CD margins may be mitigated. In specific embodiments, processes described herein are more tolerant to edge-placement errors, in which an aerial image does not perfectly align to an electrobucket grid. As a result, the selected locations are ultimately cleared to provide open electrobucket locations following development. The non-selected locations which may also receive some exposure remain as closed electrobucket locations following development.

Figure 2B:
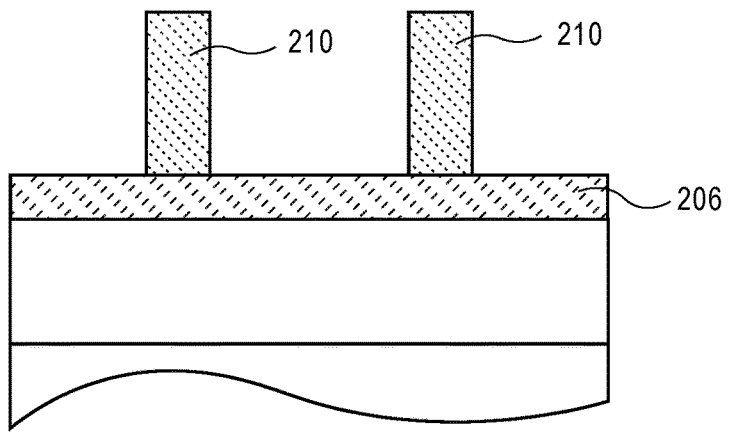
Figure 2C:
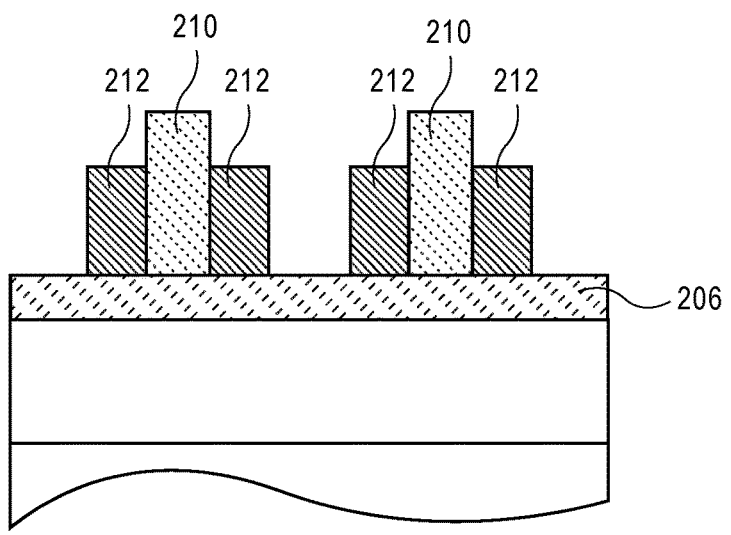
Figure 2D:
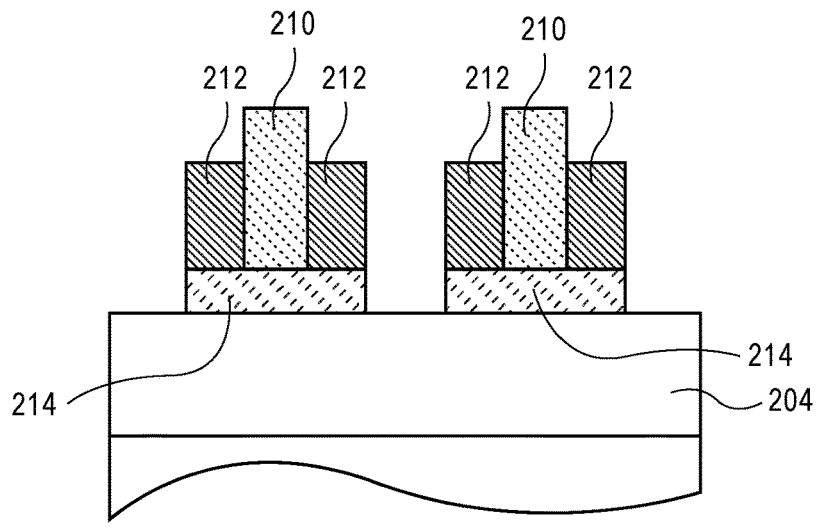
Figure 2E:
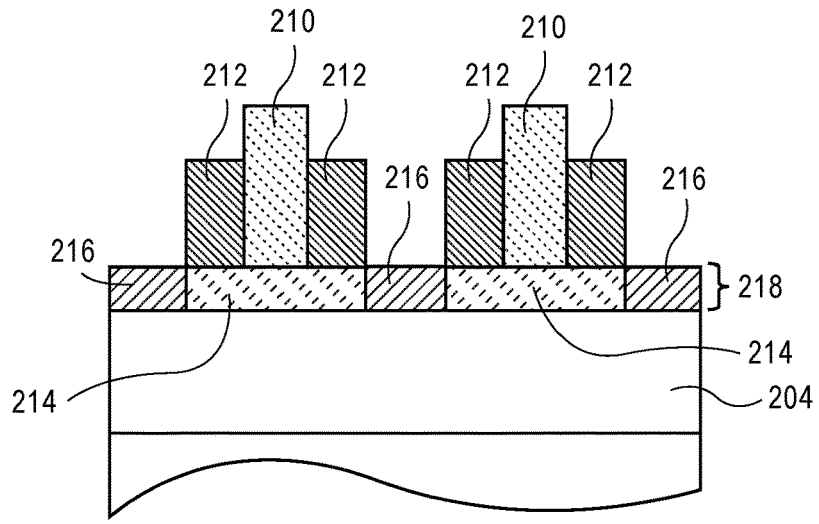
Figure 2F:
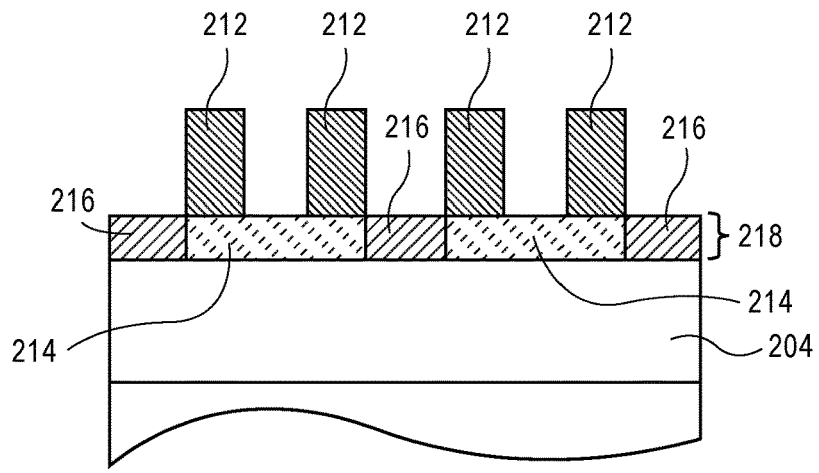
Figure 2G:
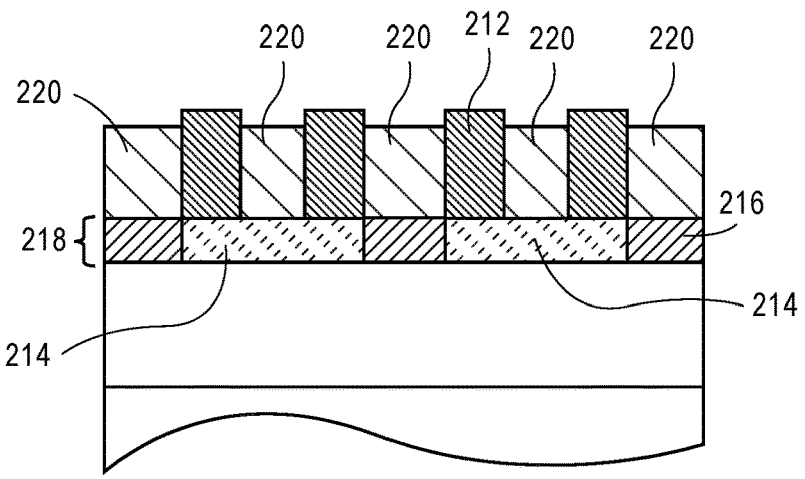
Figure 2H:
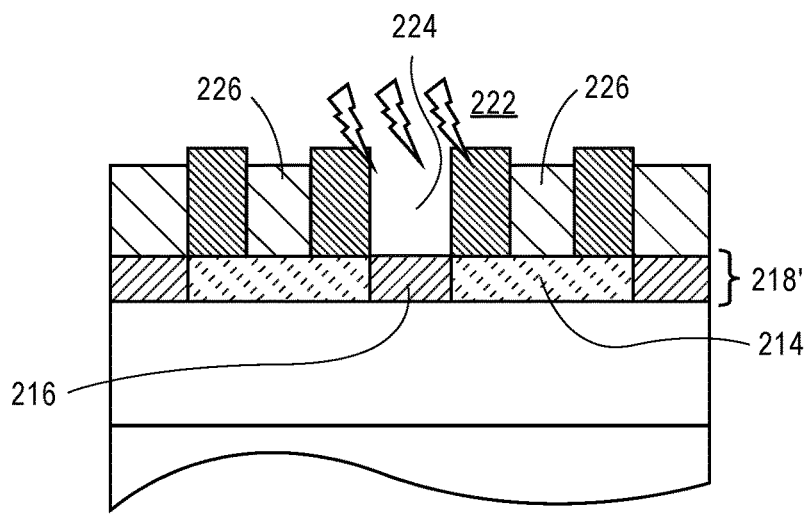
Figure 2I:
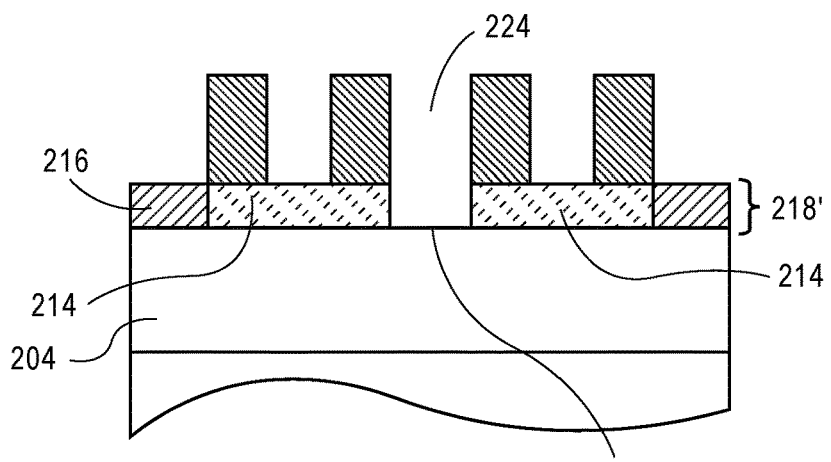
Figure 2J:
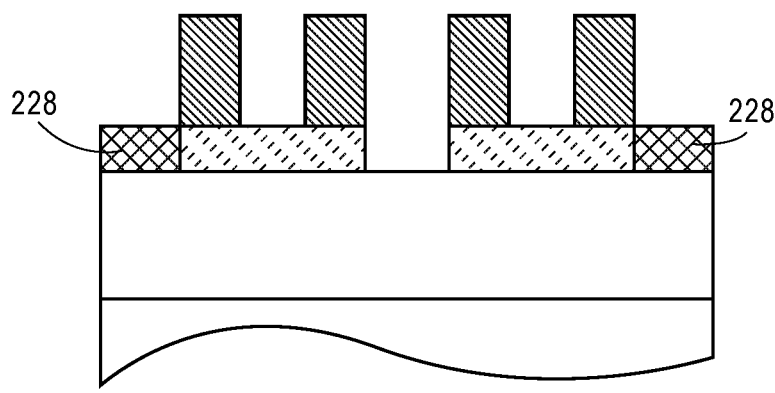
Figure 2K:
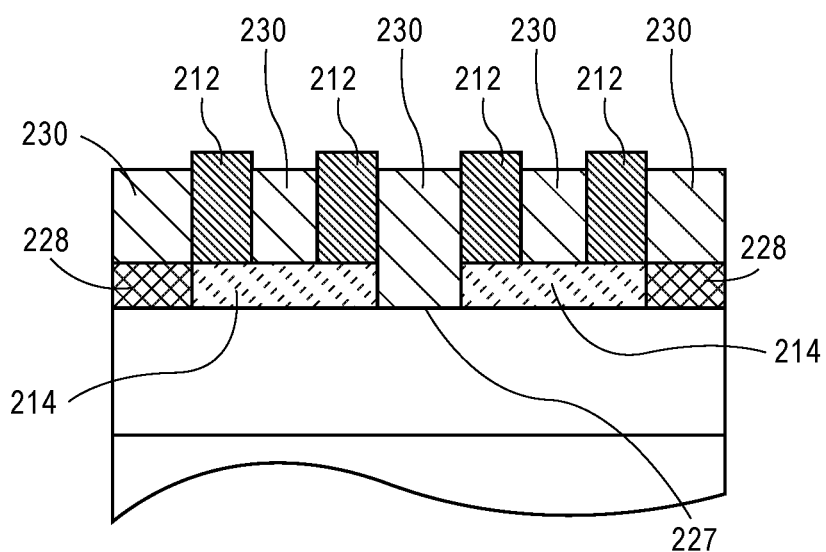
Figure 2L:
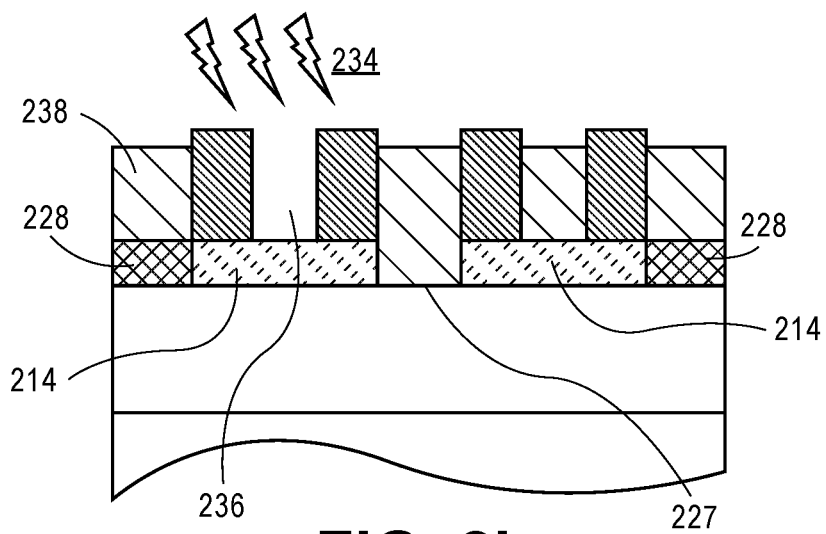
Figure 2M:
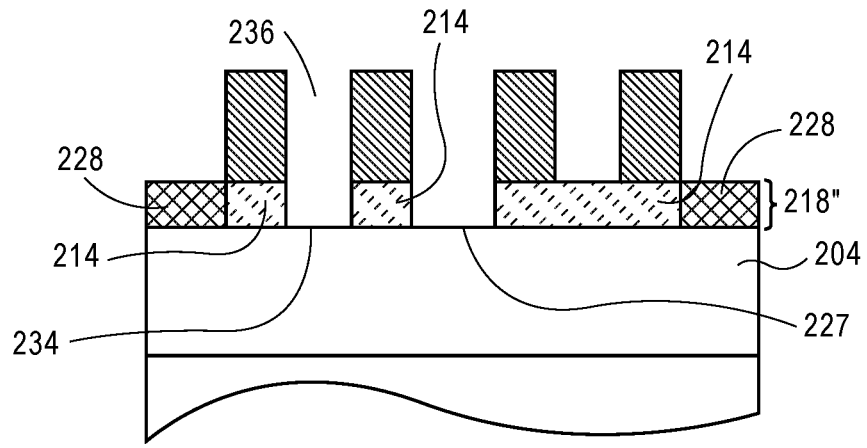
Figure 2N:
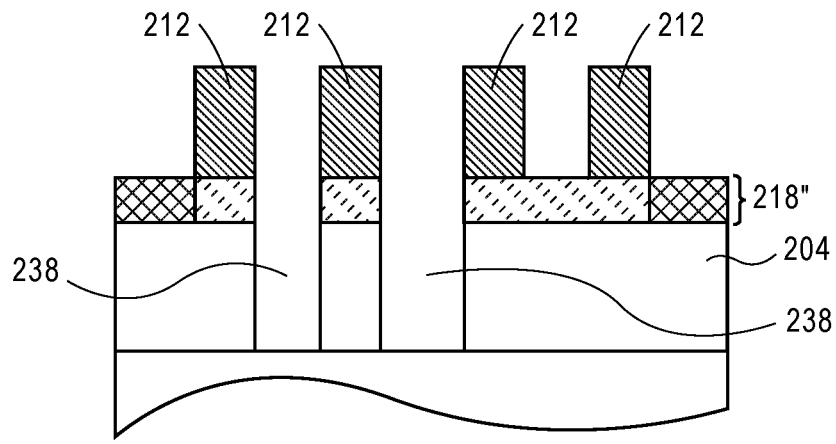
Figure 2O:
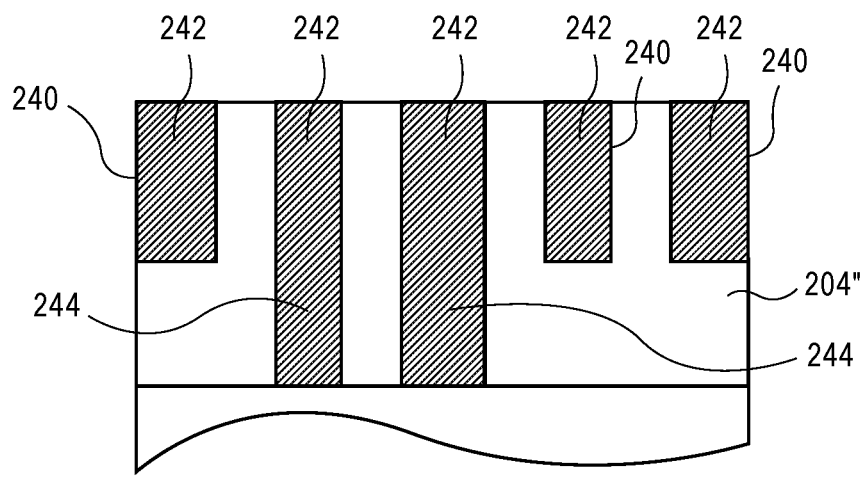

As an exemplary process scheme, FIGS. 2A-2O illustrate cross-sectional views of various operations in a method of patterning using electrobuckets with differentiated hardmasks, in accordance with an embodiment of the present invention.

Referring to FIG. 2A, a starting structure 200 for a method of patterning using electrobuckets includes a second hardmask layer 208 formed on a first hardmask layer 206 formed on or above an inter-layer dielectric (ILD) layer 204 formed above a substrate 202.

Referring to FIG. 2B, the second hardmask layer 208 is patterned to provide a plurality of backbone features 210.

Referring to FIG. 2C, a plurality of hardmask spacers 212 is formed along the sidewalls of the backbone features 210. The plurality of hardmask spacers 212 may be fabricated using a conformal deposition and subsequent anisotropic etching process. The structure of FIG. 2C may be viewed as including a grating structure of the plurality of hardmask spacers 212. In an embodiment, the grating structure includes the plurality of hardmask spacers 212 patterned using a pitch division patterning scheme, such as a pitch halving or a pitch quartering process scheme, using the plurality of backbone features 210 as a template of mandrel.

Referring to FIG. 2D, the first hardmask layer 206 is patterned to form first hardmask portions 214. In an embodiment, the first hardmask layer 206 is patterned using an etch process as masked by the plurality of hardmask spacers 212 and the backbone features 210.

Referring to FIG. 2E, second hardmask portions 216 are formed between and laterally adjacent to the first hardmask portions 214. The first hardmask portions 214 and the second hardmask portions 216 together form a differentiated hardmask 218. In one embodiment, the first hardmask portions 214 and the second hardmask portions 216 have substantially the same thickness, as is depicted in FIG. 2E. In other embodiments, the first hardmask portions 214 differ in thickness from the second hardmask portions 216.

In an embodiment, the second hardmask portions 216 are formed using a deposition and etch back process to leave second hardmask portions 216 remaining. In another embodiment, the second hardmask portions 216 are formed using a selective deposition or growth process. In one such embodiment, selective deposition or growth is achieved by first spinning-on material over the entire structure of FIG.

2D and then "washing away" material that does not adhere to the exposed portions of ILD layer 204. In another embodiment, selective deposition or growth is performed only on the exposed portions of ILD layer 204 using a chemical vapor deposition (CVD) or atomic layer deposition (ALD) process. Whether a blanket deposition and etch process or a selective deposition or growth process is used, in an embodiment, the second hardmask portions 216 are ultimately only formed between alternating pairs of neighboring spacer features 212 and not between each pair of spacer features 212 (i.e., at locations 110).

Referring to FIG. 2F, the plurality of backbone features 210 is removed from the structure of FIG. 2E. In an embodiment, the plurality of backbone features 210 is removed using a wet etch selective to the materials of the hardmask spacers 212, the first hardmask portions 214 and the second hardmask portions 216. In another embodiment, the plurality of backbone features 210 is removed using a dry or plasma etch selective to the materials of the hardmask spacers 212, the first hardmask portions 214 and the second hardmask portions 216.

Referring to FIG. 2G, a photoresist layer 220 is formed over the structure of FIG. 2F to form a plurality of electrobuckets. In an embodiment, the photoresist layer 220 is formed within and is confined by the hardmask spacers 212. In one such embodiment, the uppermost surface of the photoresist layer 220 is below an uppermost surface of the hardmask spacers 212, as is depicted. Alternating ones of the electrobuckets formed by deposition of the photoresist layer 220 are formed above the first hardmask portions 214 of differentiated hardmask 218, while remaining ones of the electrobuckets formed by deposition of the photoresist layer 220 are formed above the second hardmask portions 216 of differentiated hardmask 218.

In an embodiment the photoresist layer 220 is formed over the structure of FIG. 2F using a spin-on process. In an embodiment, the photoresist layer 220 has a photolyzable composition. In one such embodiment, the photolyzable composition includes an acid-deprotectable photoresist material. In an embodiment, a photo-acid generator (PAG) component is included and, in a specific embodiment, includes a material selected from the group consisting of triethyl, trimethyl and other trialkylsulfonates, where the sulfonate group is selected from the group consisting of trifluoromethylsulfonate, nonanfluorobutanesulfonate, and p-tolylsulfonate, or other examples containing —SO3 sulfonate anion bound to organic group. In an embodiment, the acid-deprotectable photoresist material is an acid-deprotectable material selected from the group consisting of a polymer, a molecular glass, a carbosilane and a metal oxide. In an embodiment, the acid-deprotectable photoresist material includes a material selected from the group consisting of a polyhydroxystyrene, a polymethacrylate, small molecular weight molecular glass versions of a polyhydroxystyrene or a polymethacrylate which contain ester functionality sensitive to acid-catalyzed deprotection to carboxylic acid, a carbosilane, and a metal oxide possessing functionality sensitive to acid catalyzed deprotection or cross-linking. In another embodiment, the photolyzable material is not a photo-acid generator (PAG)-based photolyzable material. In an embodiment, the photolyzable material is a positive tone material. In another embodiment, the photolyzable material is a negative tone material.

Referring to FIG. 2H, an electrobucket selection process involves exposing a portion of the structure of FIG. 2G to a lithography exposure 222. In an embodiment, the lithography exposure 222 is performed using a relatively large exposure window. For example, in one embodiment, a location 224 is selected as a via location for ultimate electrobucket clearance. Neighboring electrobucket locations 226 represent locations that may be otherwise be exposed and cleared by a large exposure window and/or by a mis-aligned exposure window. However, even though the electrobucket locations 226 may be exposed by lithography exposure 222, they are not opened upon eventual development because they are formed on the first hardmask portions 214 and not on the second hardmask portions 216.

In an embodiment, the lithography exposure 222 involves exposing the structure to e-beam radiation or extreme ultraviolet (EUV) radiation. In an embodiment, the radiation has a wavelength approximately 13.5 nanometers. In another embodiment, the radiation has an energy in the range of 5-150 keV. In an embodiment, radiation has an energy having a wavelength of approximately 365 nanometers.

In an embodiment, the second hardmask portions 216 are rendered or modified to provide electrobuckets thereon with greater sensitivity to e-beam or EUV exposure as compared to electrobuckets formed on the first hardmask portions 214. In another embodiment, the first hardmask portions 214 are rendered or modified to provide electrobuckets thereon with less or reduced sensitivity to e-beam or EUV exposure as compared to electrobuckets formed on the second hardmask portions 216. In either case, in an embodiment, the second hardmask portions 216 provide for increased backscatter and the generation of more secondary electrons into electrobuckets thereon versus the backscatter and the generation of more secondary electrons provided by first hardmask portions 214.

In an embodiment, subsequent to the lithography exposure 222, a bake operation is performed. In one such embodiment, the bake is performed at a temperature approximately in the range of 50-120 degrees Celsius for a duration of approximately in the range of 0.5-5 minutes. The structure may then be subjected to a development process. The development process clears the exposed electrobucket 222 at location 224 (but not at locations 226). In an embodiment, the neighboring electrobuckets at locations 226 do not clear upon development even though at least portions of the photoresist layer 220 in those locations may have been exposed to the lithography exposure 222.

In an embodiment, developing the structure of FIG. 2H includes, in the case of positive tone development, immersion or coating with standard aqueous TMAH developer (e.g., in a concentration range from 0.1M-1M) or other aqueous or alcoholic developer based on tetraalkylammonium hydroxides for 30-120 seconds followed by rinse with deionized (DI) water. In another embodiment, in the case of negative tone development, developing the structure includes immersion or coating with organic solvents such as cyclohexanone, 2-heptanone, propylene glycol methylethyl acetate or others followed by rinse with another organic solvent such as hexane, heptane, cyclohexane or the like.

Referring to FIG. 2I, using the remaining electrobuckets of photoresist layer 220 as a mask, the region of the second hardmask portion 216 of the differentiated hardmask 218 is removed from location 224 to provide a selected via location 227 in a once-patterned differentiated hardmask 218' above the now partially exposed ILD layer 204. The remaining electrobuckets of photoresist layer 220 are then removed. In an embodiment, the region of the second hardmask portion 216 of the differentiated hardmask 218 is removed from location 224 using a selective wet etch or dry or plasma etch process. The remaining electrobuckets of photoresist layer 220 are then removed using an ash process.

At this stage, with a selected via location 227 formed in the once-patterned differentiated hardmask 218', the once-patterned differentiated hardmask 218' can be used as a via patterning mask for forming line and/or via trenches in the ILD layer 204, akin to the patterning described below in association with FIG. 2N. However, it may be the case than a second via selection process is performed prior to patterning the ILD layer 204, as is described below in association with FIGS. 2J-2M.

Referring to FIG. 2J, the remaining second hardmask portions 216 of the once-patterned differentiated hardmask 218' are modified to provide modified second hardmask portions 228. In an embodiment, the modified second hardmask portions 228 provide for less reactive electrobuckets than provided for by the second hardmask portions 216. In one such embodiment, the remaining second hardmask portions 216 of the once-patterned differentiated hardmask 218' are modified by an approach described below in association with FIGS. 4A-4E or with FIGS. 5A-5D.

Referring to FIG. 2K, a photoresist layer 230 is formed over the structure of FIG. 2J to form a plurality of electrobuckets. In an embodiment, the photoresist layer 230 is formed within and is confined by the hardmask spacers 212. In one such embodiment, the uppermost surface of the photoresist layer 230 is below an uppermost surface of the hardmask spacers 212, as is depicted. Alternating ones of the electrobuckets formed by deposition of the photoresist layer 230 are formed above the first hardmask portions 214, while remaining ones of the electrobuckets formed by deposition of the photoresist layer 220 are formed above the modified second hardmask portions 228, with the exception of one electrobucket 232 formed at selected via location 227. In an embodiment, the photoresist layer 230 is the same as or similar to the photoresist layer 220 described above.

Referring to FIG. 2L, a second electrobucket selection process involves exposing a portion of the structure of FIG. 2K to a lithography exposure 234, which may be similar to the lithography exposure 222 described above. In an embodiment, the lithography exposure 234 is performed using a relatively large exposure window. For example, in one embodiment, a location 236 is selected as a via location for ultimate electrobucket clearance. Neighboring electrobucket location 238 represents a location that may be otherwise be exposed and cleared by a large exposure window and/or by a mis-aligned exposure window. However, even though the electrobucket location 238 may be exposed by lithography exposure 234, it is not opened upon eventual development because it is formed on a modified second hardmask portion 228 and not on a first hardmask portion 214.

In an embodiment, the modified second hardmask portions 228 are rendered or modified to provide electrobuckets thereon with less or reduced sensitivity to e-beam or EUV exposure as compared to electrobuckets formed on the first hardmask portions 214. In another embodiment, however, the first hardmask portions 214 are rendered or modified to provide electrobuckets thereon with greater sensitivity to e-beam or EUV exposure as compared to electrobuckets formed on the modified second hardmask portions 228. In either case, in an embodiment, the first hardmask portions 214 provide for increased backscatter and the generation of more secondary electrons into electrobuckets thereon versus the backscatter and the generation of more secondary electrons provided by modified second hardmask portions 228.

In an embodiment, the electrobucket at location 236 is developed as described above for electrobucket development at location 224.

Referring to FIG. 2M, using the remaining electrobuckets of photoresist layer 230 as a mask, the region of the first hardmask portion 214 is removed from location 236 to provide a selected via location 237 in a twice-patterned differentiated hardmask 218" above the twice partially exposed ILD layer 204. The remaining electrobuckets of photoresist layer 230 are then removed. In an embodiment, the region of the first hardmask portion 214 is removed from location 236 using a selective wet etch or dry or plasma etch process. The remaining electrobuckets of photoresist layer 230 are then removed using an ash process. At this stage, in an embodiment, via selection is complete.

Referring to FIG. 2N, the structure of FIG. 2M is exposed to an etch process used to form trenches 238 in a patterned dielectric layer 204'. In one embodiment, the trenches 238 represent eventual interconnect line locations each having an associated underlying via. Accordingly, the etch process used to form trenches 238 is, in one embodiment, a via opening process based on selection and removal of one or more electrobuckets.

Referring to FIG. 2O, conductive lines and vias are fabricated. In an embodiment, conductive lines and vias are fabricated by removing remaining portions of the twice-patterned differentiated hardmask 218" not covered by the hardmask spacers 212. Conductive line trenches 240 are then formed in the patterned dielectric layer 204' to form twice-patterned dielectric layer 204". The hardmask spacers 212 and any remaining portions of the twice-patterned differentiated hardmask 218" are then removed. Subsequently, metal lines 242 and conductive vias 244 are formed in the twice-patterned dielectric layer 204", e.g., by a metal deposition and planarization process.

In either case, whether one or two via selection operations are performed, the structure of FIG. 2O, or like structures, may then be used as a foundation for forming subsequent metal line/via and ILD layers. Alternatively, the structure of FIG. 2O, or like structures, may represent the final metal interconnect layer in an integrated circuit. It is to be appreciated that the above process operations may be practiced in alternative sequences, not every operation need be performed and/or additional process operations may be performed.

It is to be appreciated that the process scheme described in association with FIGS. 2A-2O may represent a one-dimensional (1D) or a two-dimensional (2D) electrobucket approach. For example, in a 1D electrobucket approach, lines of the grating structure of hardmask spacers 212 extend without interruption over a long region. By contrast, in a 2D electrobucket approach, lines of such a grating structure may be interrupted at intervals at approximately the same pitch as the pitch of the lines of the grating structure of hardmask spacers 212.

Figure 3:
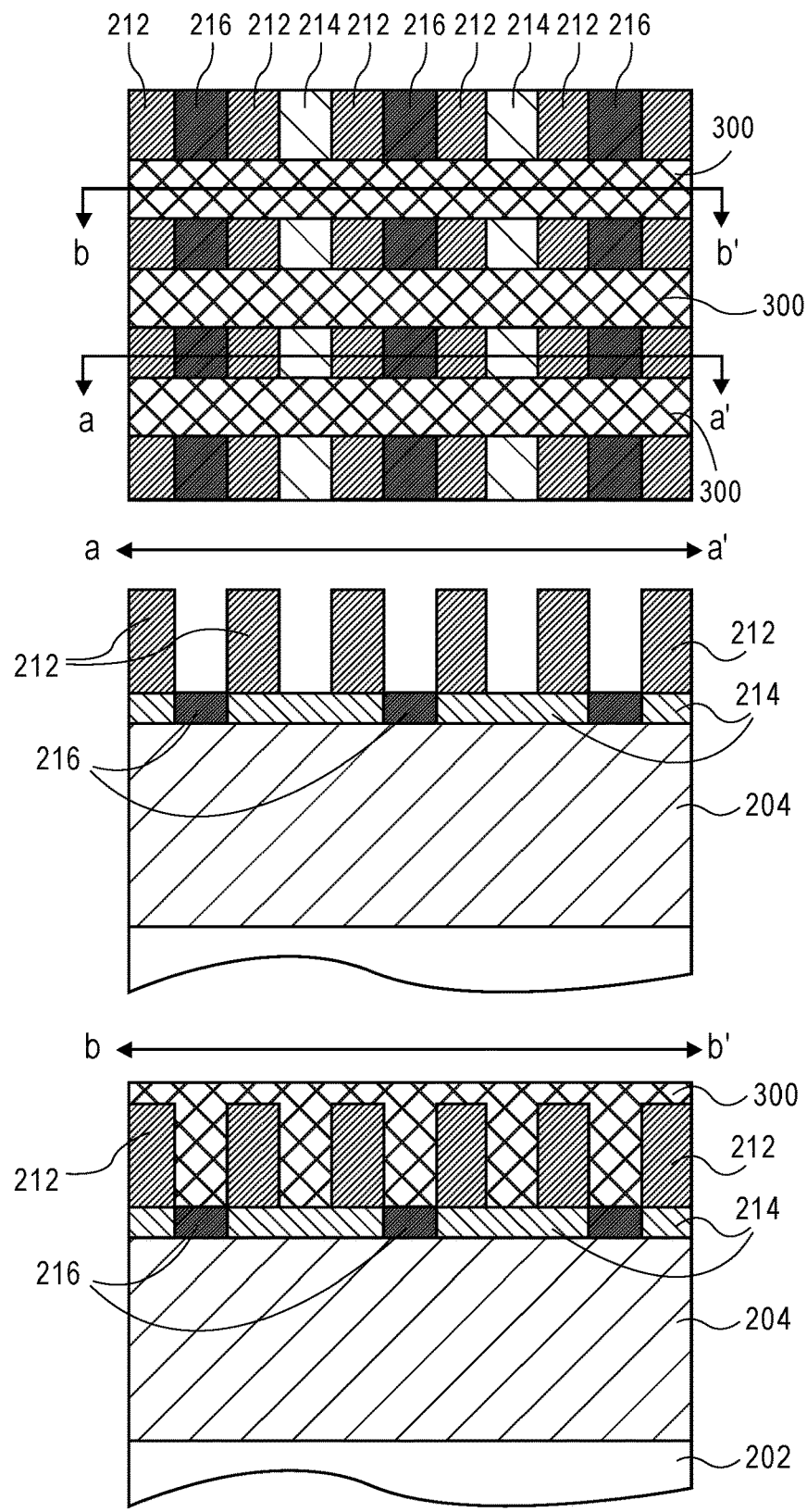
FIG. 3 illustrates a plan view and corresponding cross-sectional views of a 2-dimensional structure for patterning using electrobuckets with differentiated hardmasks, in accordance with an embodiment of the present invention.

As an example of a 2D electrobucket approach. FIG. 3 illustrates a plan view and corresponding cross-sectional views of a 2-dimensional structure for patterning using electrobuckets with differentiated hardmasks, in accordance with an embodiment of the present invention.

Referring to FIG. 3, the cross-sectional view taken along the a-a' axis represents a similar cross-section view of FIG. 2F. However, as seen in the plan view and the corresponding cross-sectional view taken along the b-b' axis of FIG. 3, a cross-grating structure 300 is formed at intervals along the grating structure of hardmask spacers 212. In one embodiment, the cross-grating structure 300 is a hardmask layer that effectively confines electrobucket locations at intervals along the grating structure of hardmask spacers 212. In an embodiment, the structure of FIG. 3 is subjected to operations described in association with FIG. 2D and on to form vias that have locations confined in two dimensions.

In an embodiment, whether a 1D or 2D approach is used, approaches described herein involve the fabrication of regular structures covering all possible feature locations, such as all possible via locations, followed by selective patterning of only the desired or select features. In an embodiment, first or second hardmask material portions remain in the final structure at the corners of metal lines underneath any mis-landed vias.

As described briefly above, a hardmask portion can be changed from a more sensitive material to a less sensitive material. In a particular embodiment, a hardmask material is initially "stuffed" (e.g., a porous carbon doped oxide stuffed with titanium nitride, TiN), and then subsequently "destuffed." In an exemplary processing scheme. FIGS. 4A-4E illustrate cross-sectional views corresponding to various operations in a method of fabricating and using a differentiated hardmask in an electrobucket process, in accordance with an embodiment of the present invention.

Figure 4A:
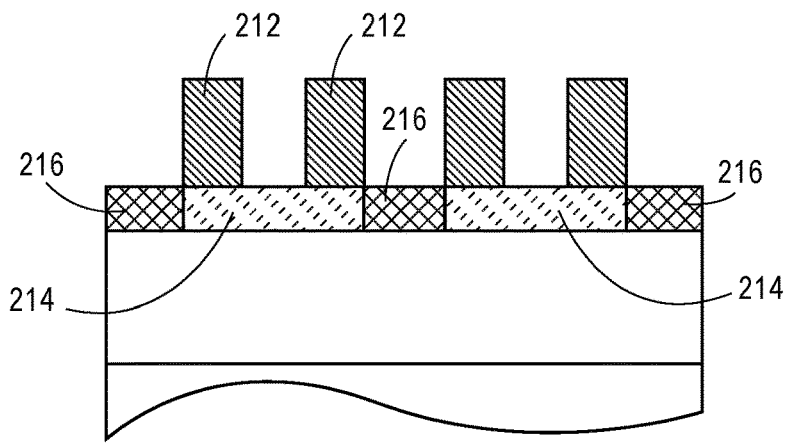

Referring to FIG. 4A, a starting structure such as the structure of FIG. 2F can include an initially porous hardmask portion 216. The porous hardmask portion 216 has a plurality of pores formed therein.

In an embodiment, the porous hardmask portion 216 is a low-k porous dielectric material layer. In an embodiment, the porous hardmask portion 216 is formed using a spin-on deposition process. In an embodiment, the porous dielectric material is a highly porous, e.g., 50%, spin-on material that has been optimized to fill high aspect ratio features. In an embodiment, the porous dielectric material has 30% or more pore density. In one such embodiment, the porous dielectric material has a porosity approximately in the range of 40-60%, and preferably around 50%. In an embodiment, the pores are open cells pores in that they are interconnected and are not closed cell pores.

In an embodiment, the porous dielectric material is selected from a class of materials based on hydrosilane precursor molecules, where catalyst mediates reaction of Si—H bonds with cross-linkers such as water, tetraethoxyorthosilicate (TEOS), hexaethoxytrisilacyclohexane or similar multifunctional cross-linkers. In one such embodiment, the porous dielectric material is based on trisilacyclohexanes linked together by O groups. In other embodiments, alkoxysilane based dielectric precursors or silsesquioxane (SSQ) are used to form the porous dielectric material. Although not limited to such material, in an embodiment, the porous dielectric material is a spin-on dielectric material based on a 1,3,5-trisilacyclohexane building block. Cross-linking with loss of solubility of such a material (or other silicon based dielectrics) can be initiated either thermally, or at lower temperatures, by use of acid, base or Lewis acid catalyst processes. In one embodiment, such low temperature catalysis is critical for the implementation of approaches described herein.

Figure 4B:
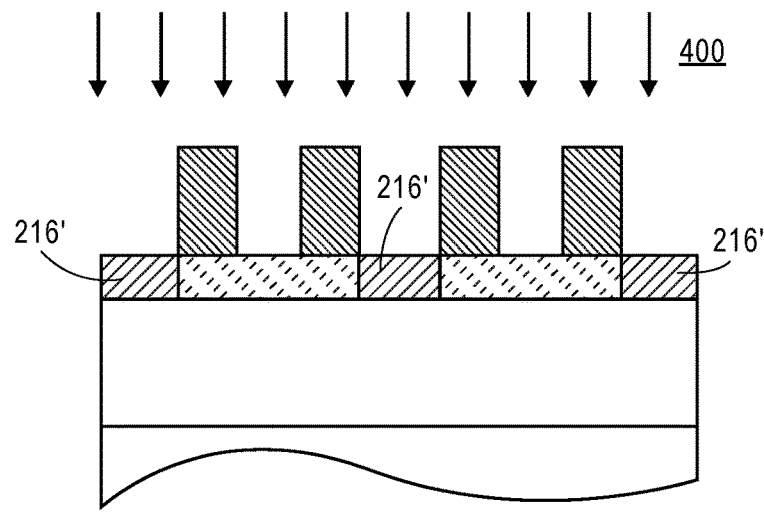

Referring to FIG. 4B, a loading process 400 is used to fill the pores of the porous hardmask portion 216 to form a pore-filled hardmask portion 216'. In an embodiment, the pore-filled hardmask portion 216' has increased response to e-beam or EUV lithography to enhance electrobucket sensitivity.

In an embodiment, the pores of the porous dielectric material are filled using an atomic layer deposition (ALD) process. In one such embodiment, a slow and penetrating ALD process is used to fill the pores of the porous dielectric material. By using the above described two-operation process of spin-on deposition followed by ALD pore filling, chemical stability of the resulting pore-filled material may be achieved. In other embodiments, the pores of the porous dielectric material are filled using a second spin-on process.

In an embodiment, the pores of the porous dielectric material are filled with a metal-containing material. In one such embodiment, the metal-containing material is a metal nitride such as, but not limited to, titanium nitride (TiN) or tantalum nitride (TaN). In another such embodiment, the metal-containing material is a metal oxide such as, but not limited to, tantalum oxide ($Ta_2O_5$), titanium oxide ($TiO_2$), aluminum oxide ($Al_2O_3$), or hafnium oxide ($HfO_2$).

Figure 4C:
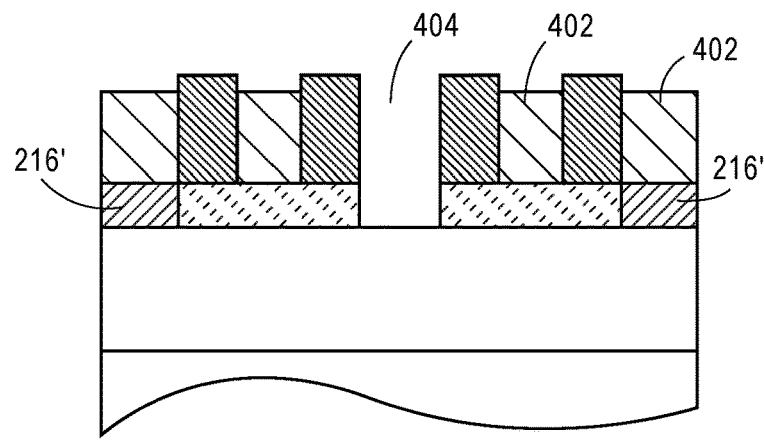

Referring to FIG. 4C, a photoresist layer 402 of electrobuckets is used to pattern a via location 404 by a process such as described above in association with FIGS. 2G-2I.

Figure 4D:
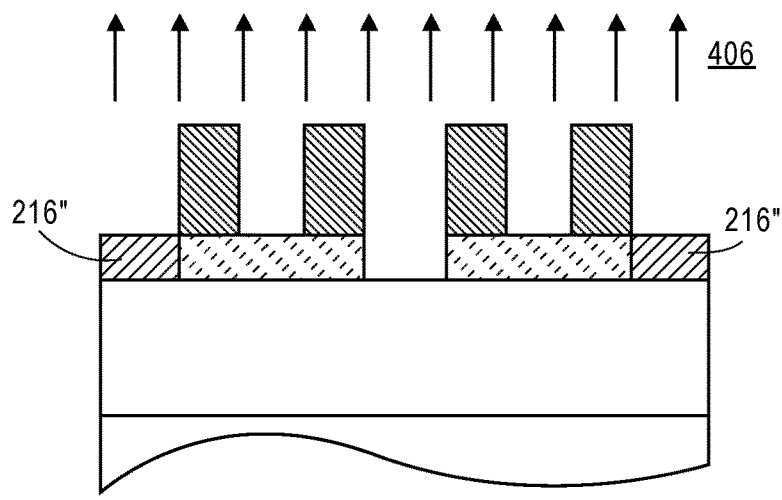

Referring to FIG. 4D, the material used to fill or "stuff" the pores to form pore-filled hardmask portion 216' are removed by a process 406, such as an evaporation or sublimation process.

Figure 4E:
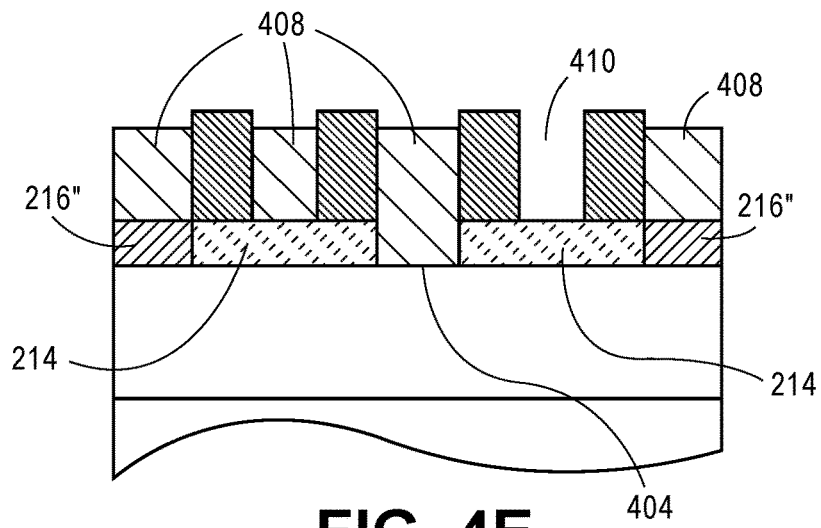

Referring to FIG. 4E, a second photoresist layer 408 of electrobuckets is used to pattern a second via location 410 over a differentiated hardmask portion 214. In an embodiment, the second via location 410 is formed by a process such as described above in association with FIGS. 2K and 2L.

In another particular embodiment, a hardmask portion is intentionally oxidized or reduced to change its electron backscatter/secondary electron generator properties. As an example, FIGS. 5A-5D illustrate cross-sectional views corresponding to various operations in another method of fabricating and using a differentiated hardmask in an electrobucket process, in accordance with another embodiment of the present invention.

Figure 5A:
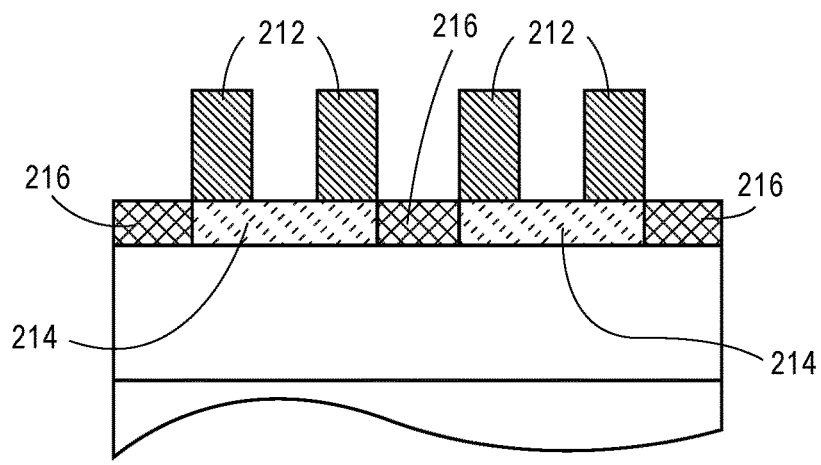
FIGS. 5A-5D illustrate cross-sectional views corresponding to various operations in another method of fabricating and using a differentiated hardmask in an electrobucket process, in accordance with another embodiment of the present invention.

Referring to FIG. 5A, a starting structure such as the structure of FIG. 2F can include an initially metallic hardmask portion 216.

Figure 5B:
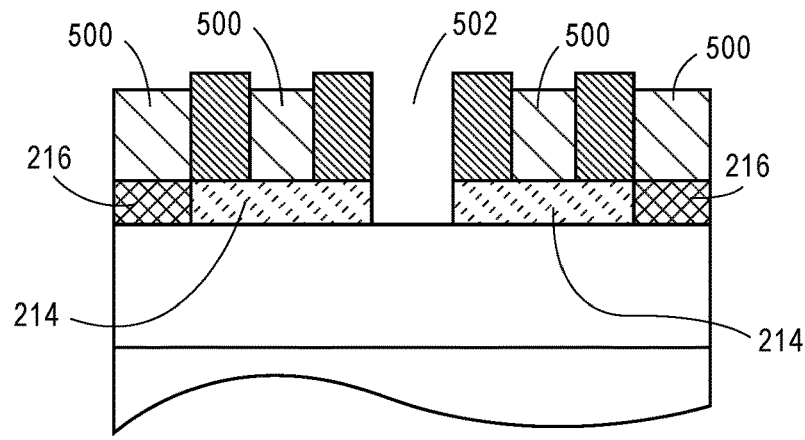

Referring to FIG. 5B, a photoresist layer 500 of electrobuckets is used to pattern a via location 502 by a process such as described above in association with FIGS. 2G-2I.

Figure 5C:
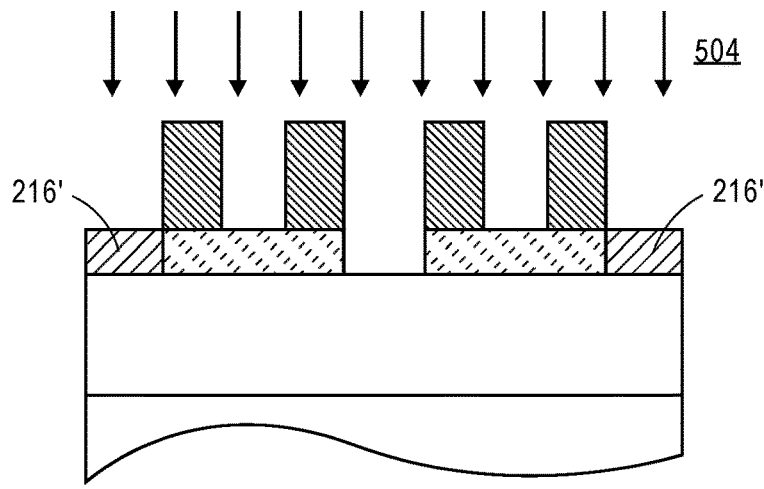

Referring to FIG. 5C, an oxidation process 504 is used to form oxidized hardmask portions 216 from metallic hardmask portions 216.

Figure 5D:
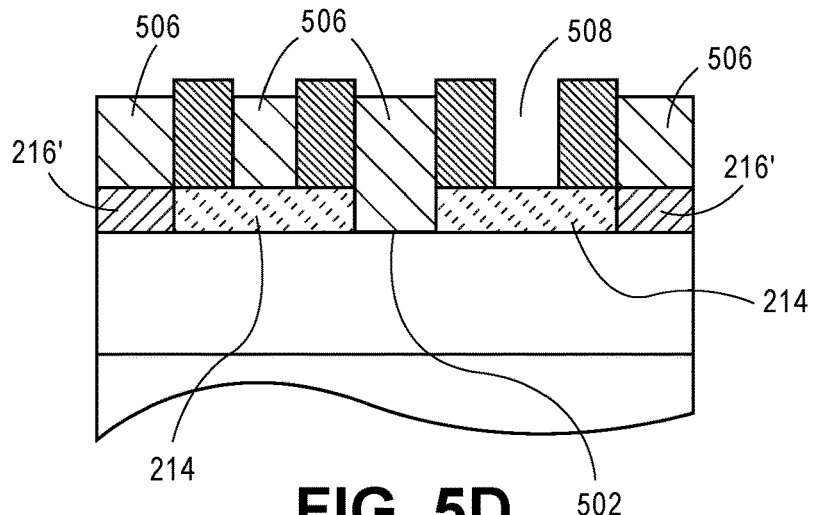

Referring to FIG. 5D, a second photoresist layer 506 of electrobuckets is used to pattern a second via location 508 over a differentiated hardmask portion 214. In an embodiment, the second via location 508 is formed by a process such as described above in association with FIGS. 2K and 2L.

In an exemplary embodiment, approaches described above build on approaches using so-called "electrobuckets," in which every possible feature, e.g. via, is pre-patterned into a substrate. Then, a photoresist is filled into patterned features and the lithography operation is merely used to choose select vias for via opening formation. In a particular embodiment described below, a lithography operation is used to define a relatively large hole above a plurality of electrobuckets that include photoresist and differentiated hardmask portions in alternating photoresist locations, as described above. Such a colored underlying hardmask photoresist electrobucket approach may be implemented to allow for larger critical dimensions (CD)s and/or errors in overlay while retaining the ability to choose the via of interest.

In general, one or more embodiments are directed to an approach that employs a subtractive technique to ultimately form conductive vias and, possibly, non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

Applications of approaches described herein may be implemented to create regular structures covering all possible via (or plug) locations, followed by selective patterning of only the desired features. More specifically, one or more embodiments described herein involves the use of a subtractive method to pre-form every via or via opening using the trenches already etched. An additional operation is then used to select which of the vias and plugs to retain. As described above, such operations can be illustrated using "electrobuckets," although the selection process may also be performed using a more conventional resist expose and ILD backfill approach.

In another aspect, a differentiated hardmask process is performed using two distinct photoresist deposition process, even though the same photoresist material may be deposited in both distinct operations. Such a two-operation photoresist approach may be used to direct or confine the effects of a differentiated hardmask material at alternating locations in that a break is provided between the photoresist material at neighboring locations. As an example, FIGS. 6A-6G illustrate cross-sectional views of various operations in a method of patterning using electrobuckets with differentiated hardmasks, in accordance with an embodiment of the present invention.

Figure 6A:
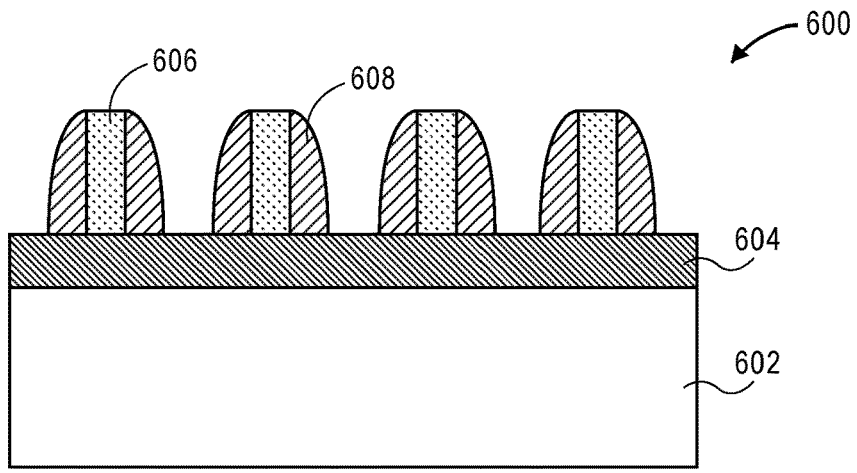
FIGS. 6A-6G illustrate cross-sectional views of various operations in a method of patterning using electrobuckets with differentiated hardmasks, in accordance with an embodiment of the present invention.

FIG. 6A illustrates a cross-sectional view of a starting structure 600 following deposition, but prior to patterning, of a first hardmask material layer 604 formed on an interlayer dielectric (ILD) layer 602, in accordance with an embodiment of the present invention. Referring to FIG. 6A, a patterned mask 606 has spacers 608 formed along sidewalls thereof, on or above the first hardmask material layer 604.

Figure 6B:
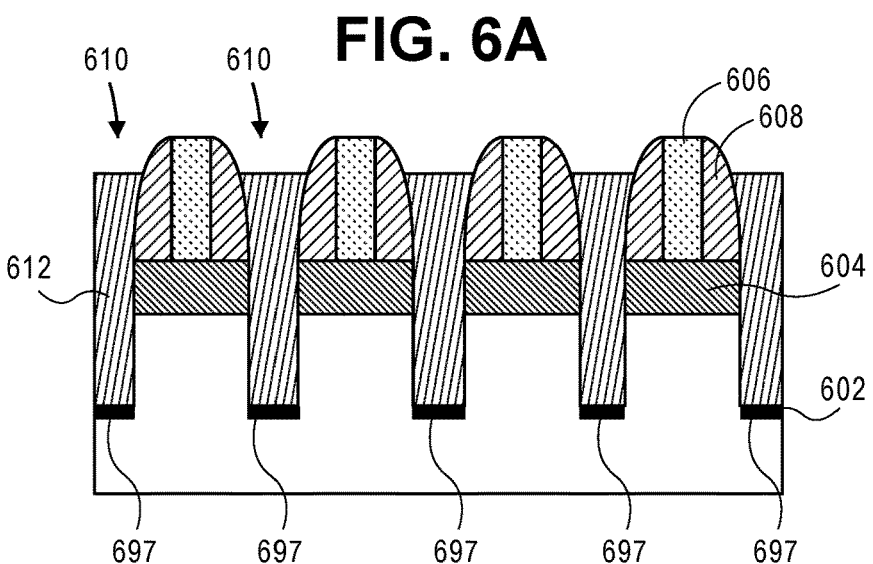

FIG. 6B illustrates the structure of FIG. 6A following first time patterning of the first hardmask layer and subsequent first electrobucket till, in accordance with an embodiment of the present invention. Referring to FIG. 6B, the patterned mask 606 and corresponding spacers 608 are used together as a mask during an etch to form trenches 610 through the first hardmask material layer 604 and partially into the ILD layer 602. The trenches 610 are then filled with first hardmask portions 697 and first electrobuckets 612 which include a photoresist material.

Figure 6C:
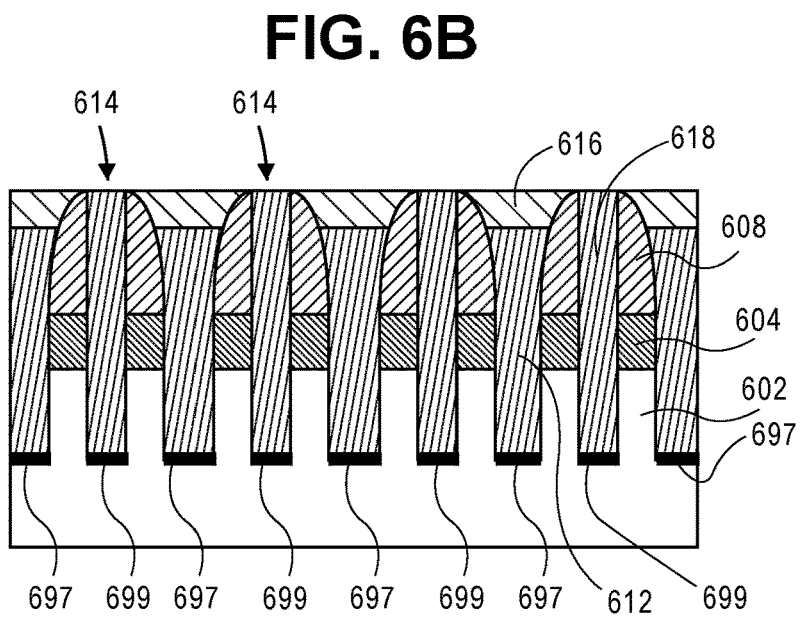

FIG. 6C illustrates the structure of FIG. 6B following second time patterning of the first hardmask layer and subsequent second electrobucket fill, in accordance with an embodiment of the present invention. Referring to FIG. 6C, the patterned mask 606 is removed and a second plurality of trenches 614 is etched through the first hardmask material layer 604 and partially into the ILD layer 602, between spacers 608. Subsequently, the trenches 614 are filled with second hardmask portions 699 and second electrobuckets 618 which include a photoresist material. In one such embodiment, the second electrobuckets 618 and the first electrobuckets 612 are filled with the same photoresist material.

In an embodiment, the first hardmask portions 697 are rendered or modified to provide electrobuckets thereon with greater sensitivity to e-beam or EUV exposure as compared to electrobuckets formed on the second hardmask portions 699. In another embodiment, the second hardmask portions 699 are rendered or modified to provide electrobuckets thereon with less or reduced sensitivity to e-beam or EUV exposure as compared to electrobuckets formed on the first hardmask portions 697. In either case, in an embodiment, the first hardmask portions 697 provide for increased backscatter and the generation of more secondary electrons into electrobuckets thereon versus the backscatter and the generation of more secondary electrons provided by second hardmask portions 699.

Referring again to FIG. 6C, the negative pattern of the spacers 608 is thus transferred, e.g., by two etch processes forming trenches 610 and 614, to the first hardmask material layer 604. In one such embodiment, the spacers 608 and, hence, the trenches 610 and 614 are formed with a grating pattern, as is depicted in FIG. 6C. In an embodiment, the grating pattern is a tight pitch grating pattern. In a specific such embodiment, the tight pitch is not achievable directly through conventional lithography. For example, a pattern based on conventional lithography may first be limited to mask 606, but the pitch may be halved by the use of negative spacer mask patterning, as is depicted in FIGS. 6A-6C. Even further, although not shown, the original pitch may be quartered by a second round of spacer mask patterning. Accordingly, the grating-like pattern of the electrobuckets 612 and 618, collectively, is spaced at a constant pitch and has a constant width.

Figure 6D:
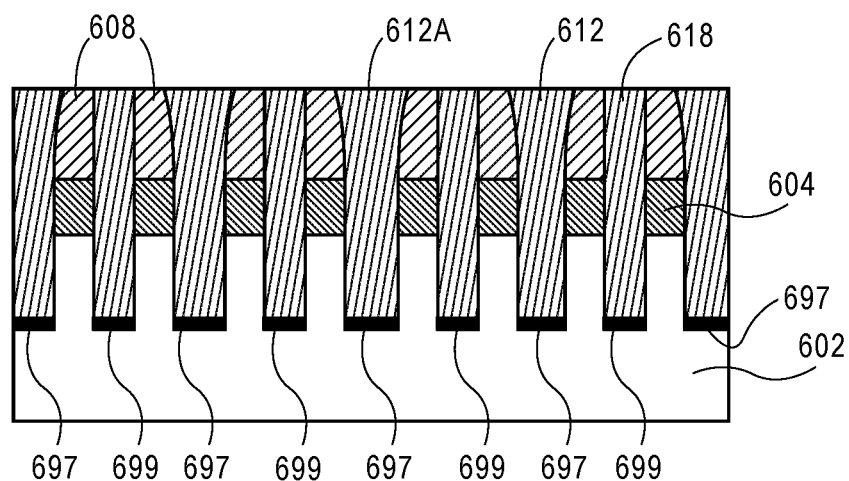

FIG. 6D illustrates the structure of FIG. 6C following planarization to isolate the first and second electrobuckets from one another, in accordance with an embodiment of the present invention. Referring to FIG. 6D, the second electrobuckets 618 and the top portions of the spacers 608 are planarized, e.g., by chemical mechanical polishing (CMP), until the top surfaces of the first electrobuckets 612 are exposed, forming discrete second electrobuckets 618. In one embodiment, the combination of first electrobuckets 612 and second electrobuckets 618 represent all possible via locations in a subsequently formed metallization structure. One of the first electrobuckets 612 is labeled as 612A to indicate that it is selected from removal for ultimate via fabrication.

Figure 6E:
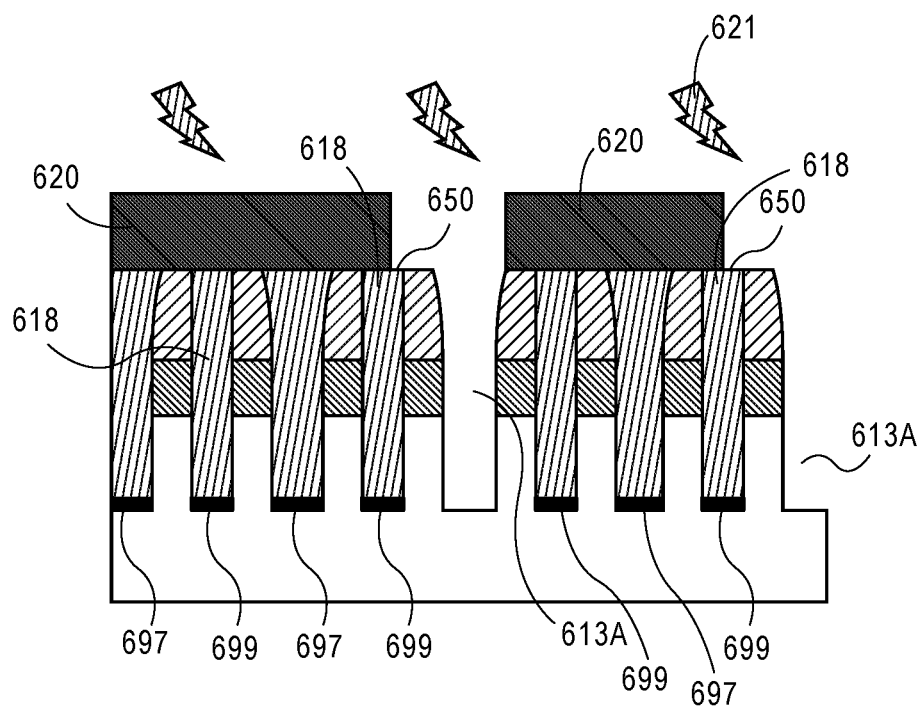

FIG. 6E illustrates the structure of FIG. 6D following exposure and development of two electrobuckets to leave selected via locations, in accordance with an embodiment of the present invention. Referring to FIG. 6E, a second hardmask 620 is formed and patterned on the structure of FIG. 6D. The patterned second hardmask 620 reveals two of the first electrobuckets 612. The selected electrobuckets are exposed to light irradiation, such as an e-beam or EUV exposure 621. It is to be appreciated that description herein concerning forming and patterning a hardmask layer involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a patterned hardmask layer.

In accordance with one embodiment, referring again to FIG. 6E, neighboring one of the second electrobuckets 618 are partially exposed, e.g., due to mis-alignment in the patterning of second hardmask 620. In particular, two of the second electrobuckets 618 are inadvertently exposed at regions 650, even though they have not been selected as locations for via fabrication. Thus, the selected ones of the first electrobuckets 612 are exposed to the EUV or e-beam radiation to a greater extent than the neighboring partially exposed ones of the second electrobuckets 618. Subsequent to exposing the structure to EUV or e-beam radiation 621, a first bake of the electrobuckets is performed. Subsequent to performing the first bake, the structure is exposed to ultraviolet (UV) radiation. In one embodiment, the mask 620 remains during the UV radiation and is then subsequently removed. However, in another embodiment, the mask 620 is first removed and the electrobuckets are then all exposed to the UV radiation to approximately the same extent. In either case, subsequent to exposing the structure to UV radiation, a second bake of the electrobuckets is performed.

Referring again to FIG. 6E, the electrobuckets are subjected to a develop process. During the develop process, the select one of the first electrobuckets 612 targeted for via fabrication are emptied in that the photoresist is removable. However, locations not selected for via fabrication, including the ones of the second electrobuckets 618 that were partially exposed at regions 650, are not opened during the develop process, in that the resist material is not removable in the develop process because of the second hardmask portions 699, as described above. The developing provides selected via openings 613A.

Figure 6F:
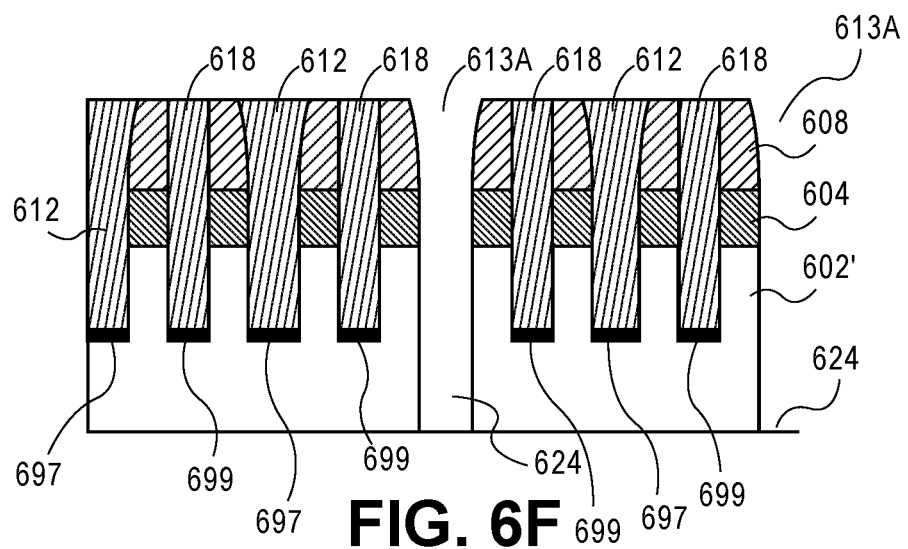

FIG. 6F illustrates the structure of FIG. 6E following etching to form via locations, in accordance with an embodiment of the present invention. Referring to FIG. 6F, the pattern of the via openings 613A are subjected to a selective etch process, such as a selective plasma etch process, to extend the via openings deeper into the underlying ILD layer 602, forming via patterned ILD layer 602' with via locations 624. The etching is selective to remaining electrobuckets 612 and 618 and to the spacers 608.

Figure 6G:
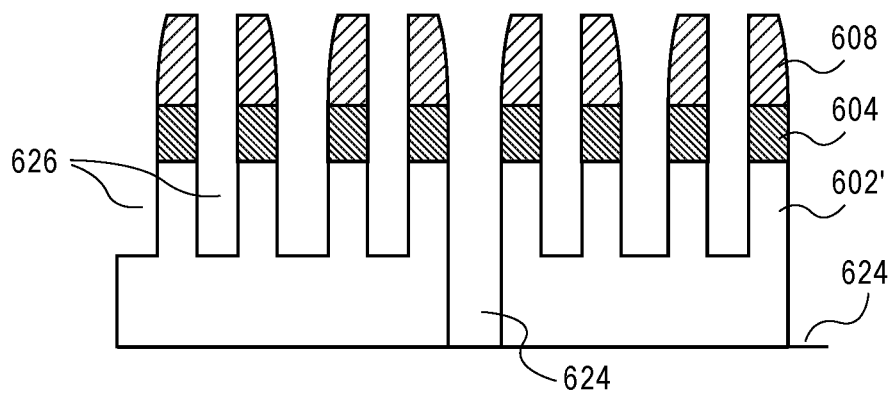

FIG. 6G illustrates the structure of FIG. 6F in preparation for metal fill, in accordance with an embodiment of the present invention. Referring to FIG. 6G, all remaining first and second electrobuckets 612 and 618 are removed. The remaining first and second electrobuckets 612 and 618 may be removed directly, or may first be exposed and developed to enable removal. The removal of the remaining first and second electrobuckets 612 and 618 provides metal line trenches 626, some of which are coupled to via locations 624 in patterned ILD layer 602'.

Figure 7:
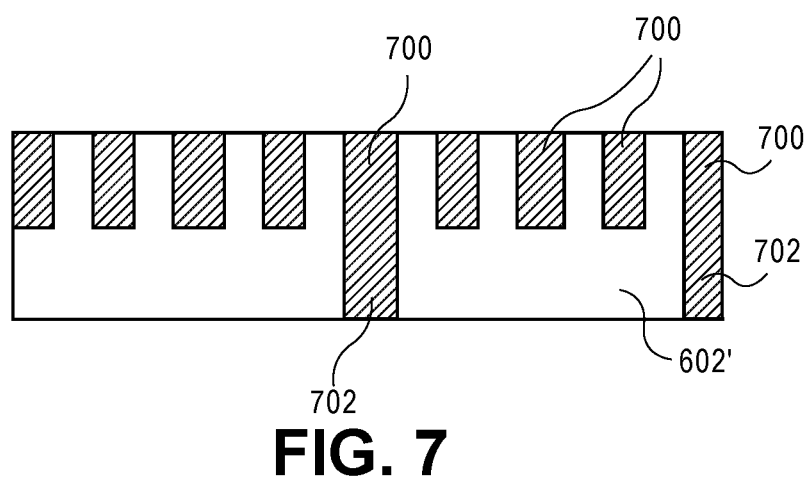
FIG. 7 illustrates a cross-sectional view of the structure of FIG. 6G following metal fill and planarization to provide a metallization layer, in accordance with an embodiment of the present invention.

FIG. 7 illustrates a cross-sectional view of the structure of FIG. 6G following metal fill and planarization to provide a metallization layer, in accordance with an embodiment of the present invention. Referring to FIG. 7, subsequent processing can include removal of spacers 608 and hardmask layer 604, and metal fill of metal line trenches 626 and via locations 624 to form conductive metal lines 700 and conductive vias 702, respectively. In one such embodiment, metallization is formed by a metal fill and polish back process. The structure of FIG. 7 may subsequently be used as a foundation for forming subsequent metal line/via and ILD layers. Alternatively, the structure of FIG. 7 may represent the final metal interconnect layer in an integrated circuit. It is to be appreciated that the above process operations may be practiced in alternative sequences, not every operation need be performed and/or additional process operations may be performed. Referring again to FIG. 7, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Additionally, it is to be appreciated that the approaches described in association with FIGS. 6A-6G and 7 are not necessarily performed as forming vias aligned to an underlying metallization layer. As such, in some contexts, these process schemes could be viewed as involving blind shooting in the top down direction with respect to any underlying metallization layers. In another aspect, a subtractive approach provides alignment with an underlying metallization layer. Furthermore, a portion or remnant of a differentiated hardmask may be retained as a portion of an interlayer dielectric of a metallization layer. As an example of both such aspects, FIGS. 8A-8I illustrate portions of integrated circuit layers representing various operations in a method of subtractive self-aligned via patterning using electrobuckets with differentiated hardmasks, in accordance with another embodiment of the present invention. In each illustration, at each described operation, an angled three-dimensional cross-section view is provided.

Figure 8A:
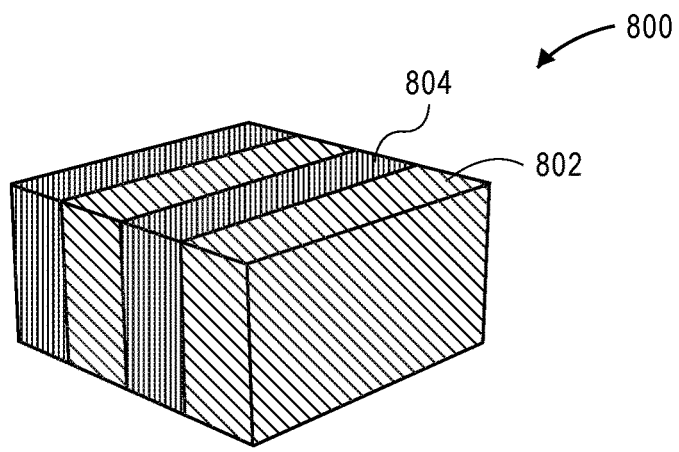
FIGS. 8A-8I illustrate portions of integrated circuit layers representing various operations in a method of subtractive self-aligned via patterning using electrobuckets with differentiated hardmasks, in accordance with another embodiment of the present invention, where.

FIG. 8A illustrates a starting point structure 800 for a subtractive via process following deep metal line fabrication, in accordance with an embodiment of the present invention. Referring to FIG. 8A, structure 800 includes metal lines 802 with intervening interlayer dielectric (ILD) lines 804. It is to be appreciated that some of the lines 802 may be associated with underlying vias for coupling to a previous interconnect layer. In an embodiment, the metal lines 802 are formed by patterning trenches into an ILD material (e.g., the ILD material of lines 804). The trenches are then filled by metal and, if needed, planarized to the top of the ILD lines 804. In an embodiment, the metal trench and fill process involves high aspect ratio features. For example, in one embodiment, the aspect ratio of metal line height (h) to metal line width (w) is approximately in the range of 5-10.

Figure 8B:
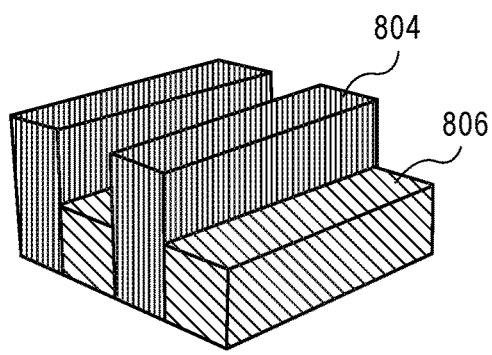

FIG. 8B illustrates the structure of FIG. 8A following recessing of the metal lines, in accordance with an embodiment of the present invention. Referring to FIG. 8B, the metal lines 802 are recessed selectively to provide first level metal lines 806. The recessing is performed selectively to the ILD lines 804. The recessing may be performed by etching through dry etch, wet etch, or a combination thereof. The extent of recessing may be determined by the targeted thickness of the first level metal lines 806 for use as suitable conductive interconnect lines within a back end of line (BEOL) interconnect structure.

Figure 8C:
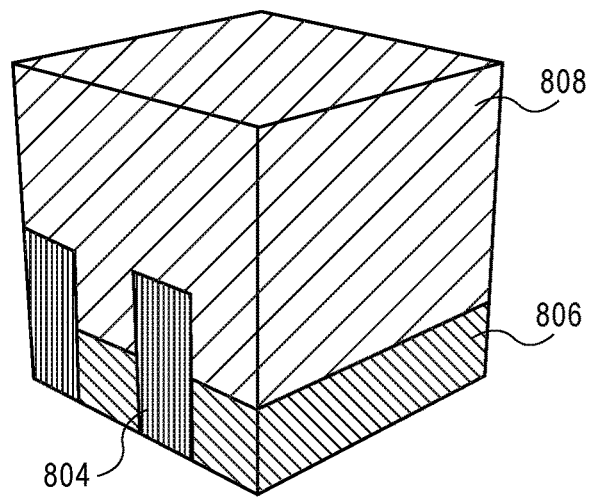

FIG. 8C illustrates the structure of FIG. 8B following formation of an inter-layer dielectric (ILD) layer, in accordance with an embodiment of the present invention. Referring to FIG. 8C, an ILD material layer 808 is deposited and, if necessary, planarized, to a level above the recessed metal lines 806 and the ILD lines 804.

Figure 8D:
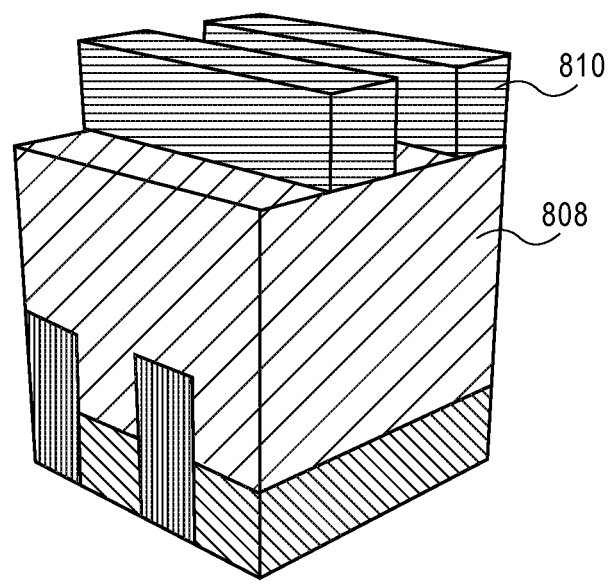

FIG. 8D illustrates the structure of FIG. 8C following deposition and patterning of a hardmask layer, in accordance with an embodiment of the present invention. Referring to FIG. 8D a hardmask layer 810 is formed on the ILD layer 808. In one such embodiment, the hardmask layer 810 is formed with a grating pattern orthogonal to the grating pattern of the first level metal lines 806/ILD lines 804, as is depicted in FIG. 8D. In an embodiment, the grating structure formed by the hardmask layer 810 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 810 of FIG. 8D may have hardmask lines spaced at a constant pitch and having a constant width.

Figure 8E:
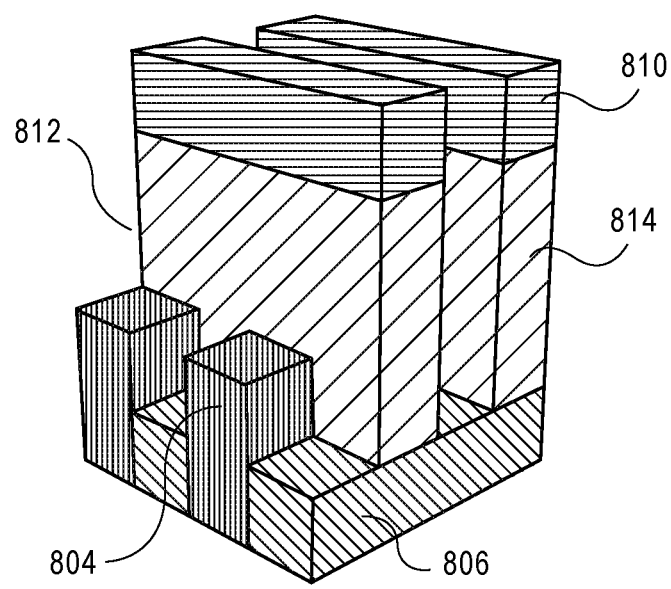

FIG. 8E illustrates the structure of FIG. 8D following trench formation defined using the pattern of the hardmask of FIG. 8D, in accordance with an embodiment of the present invention. Referring to FIG. 8E, the exposed regions (i.e., unprotected by 810) of the ILD layer 808 are etched to form trenches 812 and patterned ILD layer 814. The etch stops on, and thus exposes, the top surfaces of the first level metal lines 806 and the an lines 804.

Figure 8F:
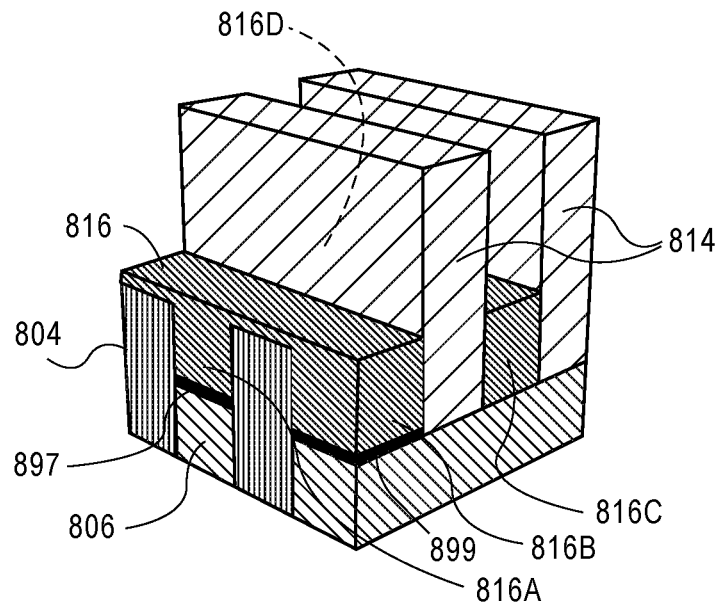

FIG. 8F illustrates the structure of FIG. 8E following electrobucket formation in all possible via locations, in accordance with an embodiment of the present invention. Referring to FIG. 8F, first and second hardmask portions 897 and 899, respectively, are included in alternating locations of all possible via locations. A photoresist 816 is then formed in all possible via locations above exposed portions of the recessed metal lines 806. The photoresist material 816 is included in a plurality of electrobucket locations, of which locations 816A, 816B and 816C are depicted in FIG. 8F. Thus, three different possible via locations 816A, 816B and 816C can be seen in the view provided in FIG. 8F. Additionally, as depicted, the hardmask layer 810 may be removed from the patterned ILD layer 814.

In an embodiment, the first hardmask portions 897 are rendered or modified to provide electrobuckets thereon with greater sensitivity to e-beam or UN exposure as compared to electrobuckets formed on the second hardmask portions 899. In another embodiment, the second hardmask portions 899 are rendered or modified to provide electrobuckets thereon with less or reduced sensitivity to e-beam or EUV exposure as compared to electrobuckets formed on the first hardmask portions 897. In either case, in an embodiment, the first hardmask portions 897 provide for increased backscatter and the generation of more secondary electrons into electrobuckets thereon versus the backscatter and the generation of more secondary electrons provided by second hardmask portions 899.

It is also to be appreciated that the photoresist layer 816 may not ultimately be completely confined and separated in the electrobucket locations. That is, in other embodiments, a photoresist layer is used as a continuous layer over a grating structure. In one embodiment, then, the photoresist 816 is formed above and over the top surfaces of the ILD lines 804, as is depicted in FIG. 8F.

Figure 8G:
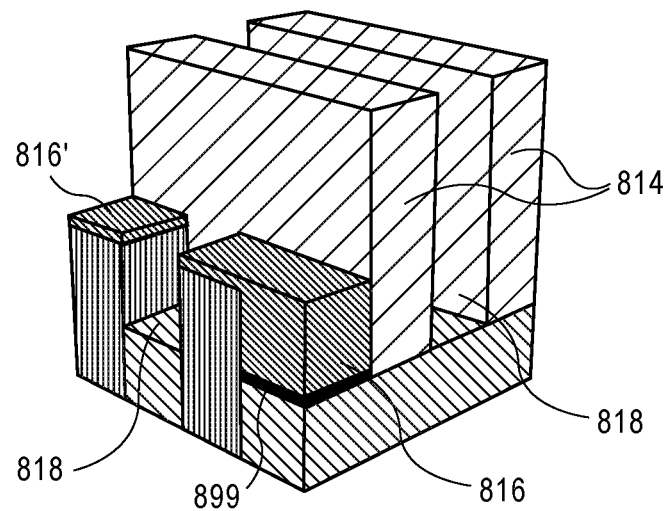

FIG. 8G illustrates the structure of FIG. 8F following via location selection, in accordance with an embodiment of the present invention. Referring to FIG. 8G, the electrobuckets 816A and 816C from FIG. 8F in select via locations 818 are removed (i.e., electrobuckets 816A and 816C are removed). In locations where vias are not selected to be formed, the photoresist 816 is retained (i.e., electrobucket 816B remains after the development process). In one embodiment, the photoresist 816 of electrobucket 816B is retained along with residual portions 816'. In one embodiment, electrobucket 816B is at least partially exposed during exposure of electrobuckets 816A and 816C. However, as described above, since the electrobucket 816B is not a select via location, the differentiated hardmask approach enables retention of electrobucket 516B.

Figure 8H:
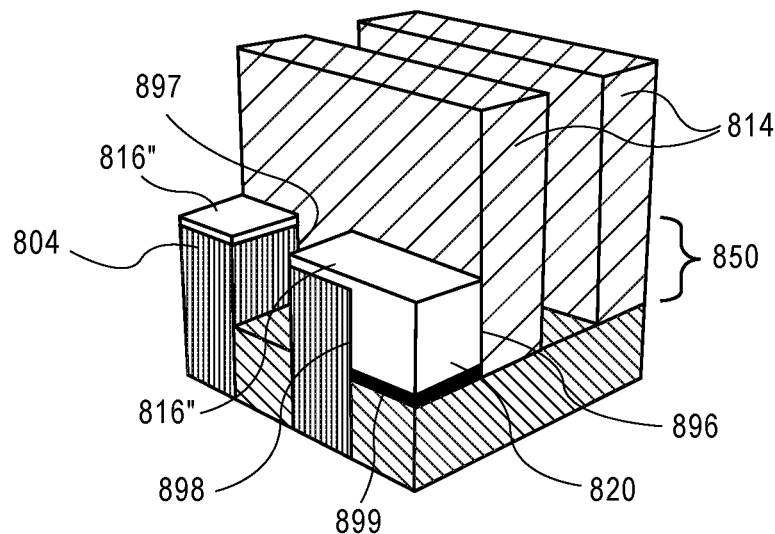

FIG. 8H illustrates the structure of FIG. 8G following conversion of the remaining electrobucket material, e.g., electrobucket 816B and, if present, residual photoresist 816', to permanent ILD material 820 and 816", respectively. Additionally, in an embodiment, the second hardmask portion 899 is retained in the final structure as well. In an embodiment, the material of the remaining photoresist material is modified, e.g., by cross-linking upon a baking operation, and may be referred to as a cross-linked photolyzable material. In one such embodiment, the final, cross-linked material has inter-dielectric properties and, thus, can be retained in a final metallization structure. In an embodiment, the retained second hardmask portion 899 is distinct from the retained cross-linked photolyzable material in that a seam or interface is observable in the final structure. However, in other embodiments, the electrobucket material of electrobucket 816B is not converted to an ILD material and is instead ultimately removed and replaced with a permanent ILD material. In one such embodiment, the second hardmask portion 899 is also removed.

Referring again to FIG. 8H, in an embodiment, the resulting structure includes up to three different dielectric material regions (ILD lines 804+ILD lines 814+cross-linked electrobucket 820, in one embodiment) in a single plane 850 of the metallization structure. In one such embodiment, two or all of ILD lines 804, ILD lines 814, and cross-linked electrobucket 820 are composed of a same material. In another such embodiment, ILD lines 804, ILD lines 814, and cross-linked electrobucket 820 are all composed of different ILD materials. In either case, in a specific embodiment, a distinction such as a vertical seam between the materials of ILD lines 804 and ILD lines 814 (e.g., seam 897) and/or between ILD lines 804 and cross-linked electrobucket 820 (e.g., seam 898) and/or between ILD) lines 814 and cross-linked electrobucket 820 (e.g., seam 896) may be observed in the final structure.

Figure 8I:
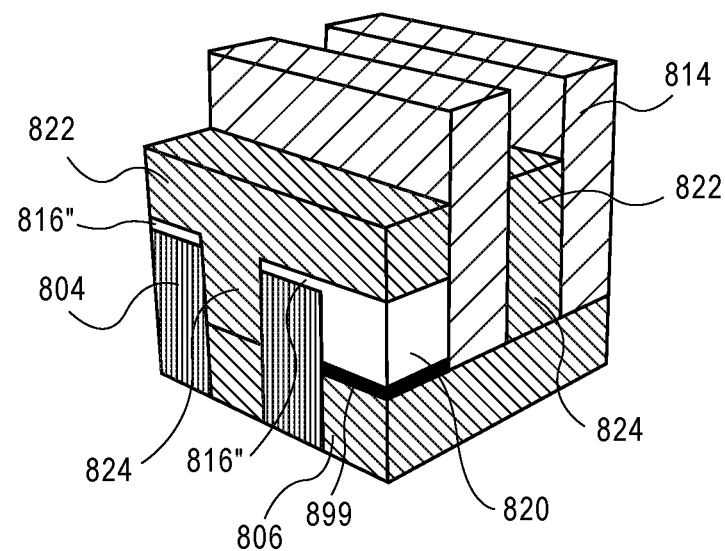

FIG. 8I illustrates the structure of FIG. 8H following metal line and via formation, in accordance with an embodiment of the present invention. Referring to FIG. 8I, metal lines 822 and vias 824 are formed upon metal fill of the openings of FIG. 8H. The metal lines 822 are coupled to the underlying metal lines 806 by the vias 824. In an embodiment, the openings are filled in a damascene approach or a bottom-up fill approach to provide the structure shown in FIG. 8I. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 814 may be removed to provide air gaps between the resulting metal lines 824.

The structure of FIG. 8I may subsequently be used as a foundation for forming subsequent metal line/via and ILD layers. Alternatively, the structure of FIG. 8I may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein. Referring again to FIG. 5I, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Overall, in accordance with one or more embodiments of the present invention, approaches described herein involve use of electrobucket interlayer dielectric (ILD) to select locations for conductive vias. The details above regarding FIGS. 2A-2O, 6A-6G, 7 and 8A-8I focus primarily on electrobuckets used for via patterning. However, it is to be appreciated that electrobuckets including a selective grating approach may also be used for dielectric plug patterning or line end patterning.

In an embodiment, the term "grating structure" or "pitch division" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers maybe formed by CVD, PVD, or by other deposition methods.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
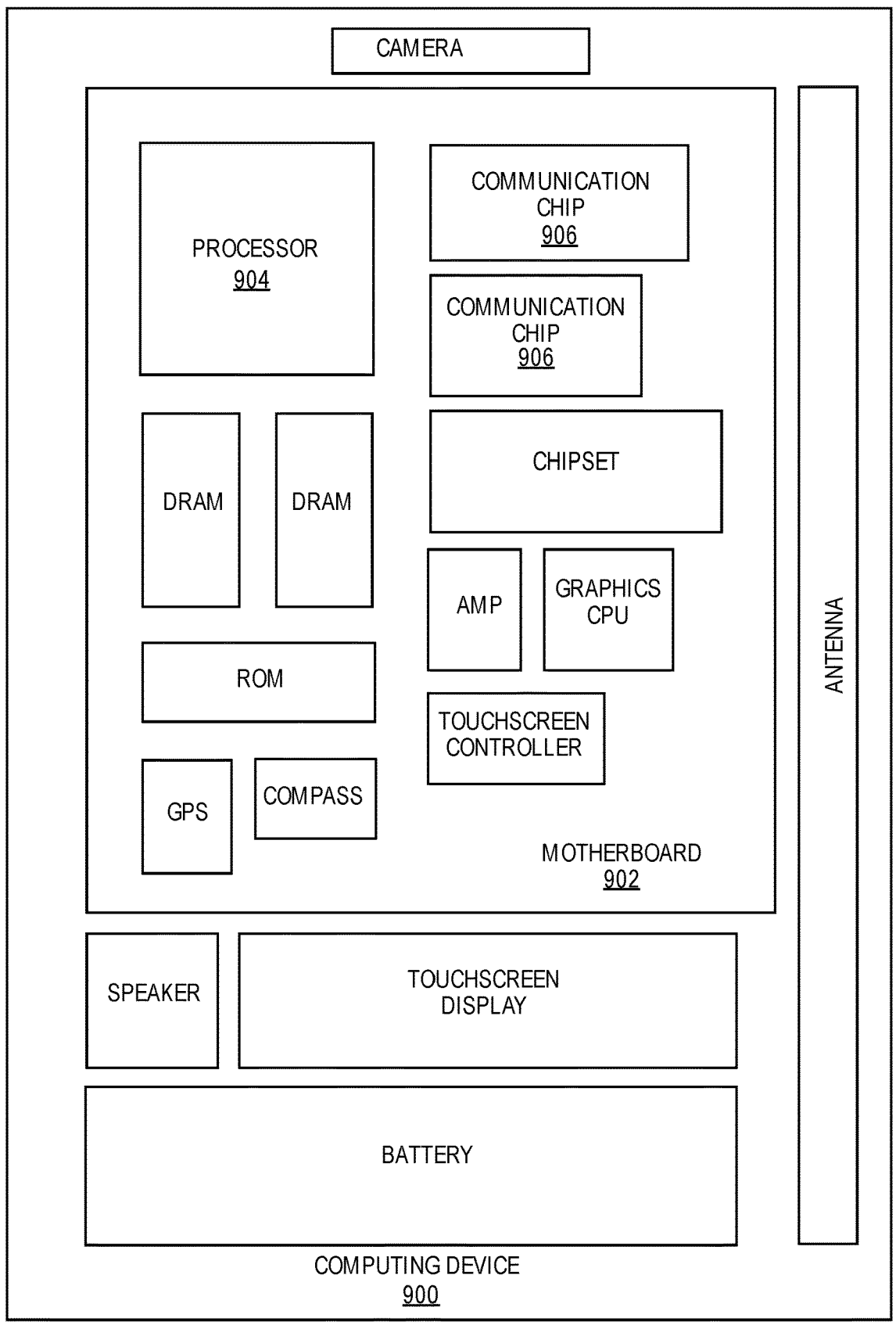
FIG. 9 illustrates a computing device in accordance with one implementation of an embodiment of the invention.

FIG. 9 illustrates a computing device 900 in accordance with one implementation of an embodiment of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of embodiments of the invention, the integrated circuit die of the processor includes one or more structures, such as conductive vias fabricated using an approach based on electrobuckets having differentiated underlying hardmasks, built in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of an embodiments of the invention, the integrated circuit die of the communication chip includes one or more structures, such as conductive vias fabricated using an approach based on electrobuckets having differentiated underlying hardmasks, in accordance with embodiments of the invention.

In further implementations, another component housed within the computing device 900 may contain an integrated circuit die that includes one or more structures, such as conductive vias fabricated using an approach based on electrobuckets having differentiated underlying hardmasks, in accordance with embodiments of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
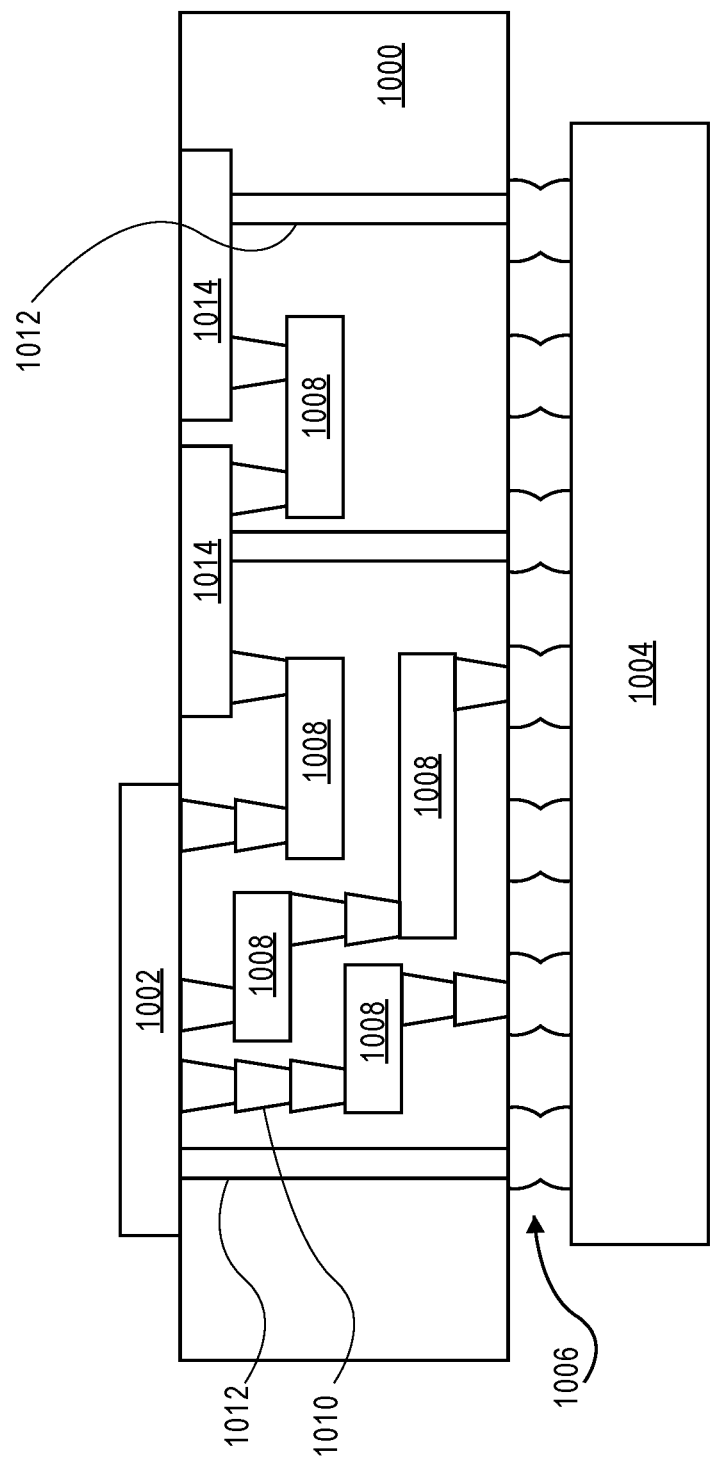
FIG. 10 is an interposer implementing one or more embodiments of the invention.

FIG. 10 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the invention, apparatuses or processes disclosed herein may be used in the fabrication of interposer 1000 or in one or more of the components of the interposer 1000.

Thus, embodiments of the present invention include approaches based on differential hardmasks for modulation of electrobucket sensitivity for semiconductor structure fabrication, and the resulting structures.

Example embodiment 1: A method of fabricating an interconnect structure for an integrated circuit includes forming a hardmask layer above an inter-layer dielectric (ILD) layer formed above a substrate. A plurality of dielectric spacers is formed on the hardmask layer. The hardmask layer is patterned to form a plurality of first hardmask portions. A plurality of second hardmask portions is formed alternating with the first hardmask portions. A plurality of electrobuckets is formed on the alternating first and second hardmask portions and in openings between the plurality of dielectric spacers. Electrobuckets formed on the first hardmask portions have a different sensitivity to e-beam or extreme ultra-violet (EUV) radiation than electrobuckets formed on the second hardmask portions. Select ones of the plurality of electrobuckets are exposed to a lithographic exposure and removed to define a set of via locations.

Example embodiment 2: The method of example embodiment 1, wherein the electrobuckets formed on the first hardmask portions have less sensitivity to the e-beam or EUV radiation than the electrobuckets formed on the second hardmask portions.

Example embodiment 3: The method of example embodiment 1, wherein the electrobuckets formed on the first hardmask portions have greater sensitivity to the e-beam or EUV radiation than the electrobuckets formed on the second hardmask portions.

Example embodiment 4: The method of example embodiment 1, 2 or 3, wherein the electrobuckets formed on the first hardmask portions have different sensitivity to the e-beam or EUV radiation than the electrobuckets formed on the second hardmask portions based on a difference in the extent of backscatter and generation of secondary electrons between the first hardmask portions and the second hardmask portions.

Example embodiment 5: The method of example embodiment 1, 3 or 4, further including etching the set of via locations into the ILD layer. Subsequent to etching the set of via locations into the ILD layer, a plurality of metal lines is formed in the ILD layer, where select ones of the plurality of metal lines include an underlying conductive via corresponding to the set of via locations.

Example embodiment 6: The method of example embodiment 1, 2, 3, 4 or 5, wherein the second hardmask portions are formed by filling pores in a porous dielectric layer with a metal-containing material.

Example embodiment 7: The method of example embodiment 1, 2, 3, 4 or 5, wherein the second hardmask portions are formed by oxidizing a metal-containing material.

Example embodiment 8: The method of example embodiment 1, 2, 3, 4, 5, 6 or 7, wherein the exposing and removing select ones of the plurality of electrobuckets involves removing electrobuckets formed on the second hardmask portions but not removing electrobuckets formed on the first hardmask portions.

Example embodiment 9: The method of example embodiment 1, 2, 4, 5, 6, 7 or 8, wherein one or more of the electrobuckets formed on the first hardmask portions are exposed to the e-beam or EUV radiation but are not removed during the removing of the select ones of the plurality of electrobuckets.

Example embodiment 10: The method of example embodiment 1, 2, 3, 4, 5, 6, 7, 8 or 9, wherein exposing and removing the select ones of the plurality of electrobuckets to define the set of via locations includes removing corresponding second hardmask portions.

Example embodiment 11: The method of example embodiment 10, further including modifying remaining second hardmask portions, forming a second plurality of electrobuckets, exposing and removing select ones of the electrobuckets formed on the first hardmask portions but not removing electrobuckets formed on the modified second hardmask portions to define a second set of via locations.

Example embodiment 12: The method of example embodiment 11, further including etching the set of via locations and the second set of via locations into the ILD layer. Subsequent to etching the set of via locations and the second set of via locations into the ILD layer, a plurality of metal lines is formed in the ILD layer, where select ones of the plurality of metal lines include an underlying conductive via corresponding to the set of via locations and to the second set of via locations.

Example embodiment 13: The method of example embodiment 1, 2, 3, 4, 5, 6, 7, 8, 9, 10, 11 or 12, wherein forming the plurality of dielectric spacers involves forming a grating structure using a pitch division processing scheme.

Example embodiment 14: An interconnect structure for an integrated circuit includes a first layer of the interconnect structure disposed above a substrate, the first layer including a first grating of alternating metal lines and dielectric lines in a first direction. The dielectric lines have an uppermost surface higher than an uppermost surface of the metal lines. A second layer of the interconnect structure is disposed above the first layer of the interconnect structure. The second layer includes a second grating of alternating metal lines and dielectric lines in a second direction, perpendicular to the first direction. The dielectric lines have a lowermost surface lower than a lowermost surface of the metal lines of the second grating. The dielectric lines of the second grating overlap and contact, but are distinct from, the dielectric lines of the first grating. A region of dielectric material is disposed between the metal lines of the first grating and the metal lines of the second grating, and in a same plane as upper portions of the dielectric lines of the first grating and lower portions of the dielectric lines of the second grating. The region of dielectric material includes a cross-linked photolyzable material disposed on a distinct underlying hardmask portion.

Example embodiment 15: The interconnect structure of example embodiment 14, wherein the cross-linked photolyzable material is a photo-acid generator (PAG)-based cross-linked photolyzable material.

Example embodiment 16: The interconnect structure of example embodiment 14 or 15, further including a conductive via disposed between and coupling a metal line of the first grating to a metal line of the second grating, the conductive via in the same plane as the region of dielectric material.

Example embodiment 17: The interconnect structure of example embodiment 16, wherein the conductive via has a center directly aligned with a center of the metal line of the first grating and with a center of the metal line of the second grating.

Example embodiment 18: The interconnect structure of example embodiment 14, 15, 16 or 17, wherein the dielectric lines of the first grating include a first dielectric material, and the dielectric lines of the second grating include a second, different dielectric material, and wherein the first and second dielectric materials are different than the cross-linked photolyzable material.

Example embodiment 19: The interconnect structure of example embodiment 14, 15, 16 or 17, wherein the dielectric lines of the first grating and the dielectric lines of the second grating include a same dielectric material different than the cross-linked photolyzable material.

Example embodiment 20: A method of fabricating an interconnect structure for an integrated circuit includes forming a mask above an ILD material layer, the mask having a plurality of spaced apart features each with a central portion and a pair of sidewall spacers. The method also includes forming, using the mask, a first plurality of trenches partially into the ILD material layer. The method also includes forming first hardmask portions and a first plurality of electrobuckets in the first plurality of trenches. The method also includes forming a second mask from the mask by removing the central portion of each feature of the mask. The method also includes forming, using the second mask, a second plurality of trenches partially into the ILD material layer. The method also includes forming second hardmask portions and a second plurality of electrobuckets in the second plurality of trenches, wherein the second plurality of electrobuckets has less sensitivity to e-beam or extreme ultra-violet (EUV) radiation than the first plurality of electrobuckets. The method also includes exposing, developing and removing fewer than all of the first plurality of electrobuckets by using a lithographic exposure. The method also includes forming via locations where the fewer than all of the first electrobuckets were remove& and forming metal vias in the via locations and metal lines above the metal vias.

Example embodiment 21: The method of example embodiment 20, wherein the first plurality of electrobuckets and the second plurality of electrobuckets are formed from a same photoresist material.

Example embodiment 22: The method of example embodiment 20 or 21, wherein the exposing involves at least partially exposing portions of the second plurality of electrobuckets, but the developing and removing does not remove the exposed portions of the second plurality of electrobuckets.

Example embodiment 23: The method of example embodiment 20, 21 or 22, wherein the first hardmask portions have a greater extent of backscatter and generation of secondary electrons than the second hardmask portions.

What is claimed is:

1. An interconnect structure for an integrated circuit, the interconnect structure comprising:
   a first layer of the interconnect structure disposed above a substrate, the first layer comprising a first grating of alternating metal lines and dielectric lines in a first direction, wherein the dielectric lines have an uppermost surface higher than an uppermost surface of the metal lines; and
   a second layer of the interconnect structure disposed above the first layer of the interconnect structure, the second layer comprising a second grating of alternating metal lines and dielectric lines in a second direction, perpendicular to the first direction, wherein the dielectric lines have a lowermost surface lower than a lowermost surface of the metal lines of the second grating, wherein the dielectric lines of the second grating overlap and contact, but are distinct from, the dielectric lines of the first grating; and
   a region of dielectric material disposed between the metal lines of the first grating and the metal lines of the second grating, and in a same plane as upper portions of the dielectric lines of the first grating and lower portions of the dielectric lines of the second grating, the region of dielectric material comprising a cross-linked photolyzable material disposed on a distinct underlying hardmask portion, wherein the distinct underlying hardmask portion includes a porous dielectric material comprising pores filled with a metal-containing material.

2. The interconnect structure of claim 1, wherein the cross-linked photolyzable material is a photo-acid generator (PAG)-based cross-linked photolyzable material.

3. The interconnect structure of claim 1, further comprising:
   a conductive via disposed between and coupling a metal line of the first grating to a metal line of the second grating, the conductive via in the same plane as the region of dielectric material.

4. The interconnect structure of claim 3, wherein the conductive via has a center directly aligned with a center of the metal line of the first grating and with a center of the metal line of the second grating.

5. The interconnect structure of claim 1, wherein the dielectric lines of the first grating comprise a first dielectric material, and the dielectric lines of the second grating comprise a second, different dielectric material, and wherein the first and second dielectric materials are different than the cross-linked photolyzable material.

6. The interconnect structure of claim 1, wherein the dielectric lines of the first grating and the dielectric lines of the second grating comprise a same dielectric material different than the cross-linked photolyzable material.

* * * * *